United States Patent
Fukuda

(10) Patent No.: US 10,937,666 B2
(45) Date of Patent: Mar. 2, 2021

(54) METHOD FOR MANUFACTURING LEAD FRAME INCLUDING ELECTRODE AND HANGER LEAD, METHOD FOR MANUFACTURING PACKAGE HAVING LEAD FRAME, AND METHOD FOR MANUFACTURING LIGHT-EMITTING DEVICE HAVING PACKAGE

(71) Applicant: NICHIA CORPORATION, Anan (JP)

(72) Inventor: Mayumi Fukuda, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/440,223

(22) Filed: Jun. 13, 2019

(65) Prior Publication Data

US 2019/0296203 A1    Sep. 26, 2019

Related U.S. Application Data

(62) Division of application No. 15/471,095, filed on Mar. 28, 2017, now Pat. No. 10,367,127.

(30) Foreign Application Priority Data

Mar. 31, 2016  (JP) .................................. 2016-071684

(51) Int. Cl.
*H01L 21/48*    (2006.01)
*H01L 23/495*   (2006.01)
(Continued)

(52) U.S. Cl.
CPC .... *H01L 21/4842* (2013.01); *H01L 23/49548* (2013.01); *H01L 23/49565* (2013.01);
(Continued)

(58) Field of Classification Search
CPC ....... H01L 21/4821–4842; H01L 33/62; H01L 33/486; H01L 23/49548; H01L 33/32;
(Continued)

(56) References Cited

U.S. PATENT DOCUMENTS 9,117,806 B2     8/2015 Yamashita et al.
2004/0046240 A1* 3/2004 Hasebe ............... H01L 23/3107
                                                      257/678
(Continued)

FOREIGN PATENT DOCUMENTS

CN    102347424 A    2/2012
CN    202917534 U    5/2013
(Continued)

OTHER PUBLICATIONS

Extended European Search Report of the corresponding European Patent Application No. 17163818.2, dated Jun. 30, 2017.
(Continued)

*Primary Examiner* — Laura M Menz
*Assistant Examiner* — Candice Chan
(74) *Attorney, Agent, or Firm* — Global IP Counselors, LLP

(57) ABSTRACT

A method for manufacturing a lead frame including: punching a metal plate disposed on a die with a punch in a direction from the metal plate toward a die side to form a punched metal, the punched metal including at least one electrode, at least one hanger lead separated from the at least one electrode, and an outer frame connected to the at least one electrode and the at least one hanger lead; and stamping at least part of a corner of an end of the at least one hanger lead, the corner being on a side corresponding to the die side, with a vertically split mold to form at least one chamfered surface.

12 Claims, 20 Drawing Sheets

(51) Int. Cl.
 *H01L 33/32* (2010.01)
 *H01L 33/48* (2010.01)
 *H01L 33/56* (2010.01)
 *H01L 33/60* (2010.01)
 *H01L 33/62* (2010.01)
 *H01L 23/00* (2006.01)

(52) U.S. Cl.
 CPC ............ *H01L 33/32* (2013.01); *H01L 33/486* (2013.01); *H01L 33/56* (2013.01); *H01L 33/60* (2013.01); *H01L 33/62* (2013.01); *H01L 24/48* (2013.01); *H01L 24/97* (2013.01); *H01L 2224/48091* (2013.01); *H01L 2224/48247* (2013.01); *H01L 2224/48257* (2013.01); *H01L 2924/00014* (2013.01); *H01L 2933/005* (2013.01); *H01L 2933/0033* (2013.01); *H01L 2933/0058* (2013.01); *H01L 2933/0066* (2013.01)

(58) Field of Classification Search
 CPC ......... H01L 33/56; H01L 33/60; H01L 24/97; H01L 2933/0066; H01L 2933/005; H01L 2933/0058; H01L 2933/0033
 See application file for complete search history.

(56) References Cited

U.S. PATENT DOCUMENTS

| | | |
|---|---|---|
| 2008/0012036 A1 | 1/2008 | Loh et al. |
| 2008/0121921 A1 | 5/2008 | Loh et al. |
| 2011/0233579 A1 | 9/2011 | Loh et al. |
| 2011/0255281 A1 | 10/2011 | Takei et al. |
| 2012/0012879 A1 | 1/2012 | Loh et al. |
| 2012/0025361 A1* | 2/2012 | Ito .................. H01L 23/047 257/676 |
| 2012/0205712 A1 | 8/2012 | Hayashi |
| 2013/0299854 A1 | 11/2013 | Lee et al. |
| 2014/0211500 A1 | 7/2014 | Min |
| 2015/0340568 A1 | 11/2015 | Hsieh et al. |
| 2016/0276263 A1 | 9/2016 | Shuutoku |

FOREIGN PATENT DOCUMENTS

| | | |
|---|---|---|
| CN | 103427009 A | 12/2013 |
| CN | 203859145 U | 10/2014 |
| CN | 203967129 U | 11/2014 |
| EP | 2665103 A2 | 11/2013 |
| JP | 60-261163 A | 12/1985 |
| JP | 07-297346 A | 11/1995 |
| JP | 10-263717 A | 10/1998 |
| JP | 2000-077590 A | 3/2000 |
| JP | 2008-072092 A | 3/2008 |
| JP | 2008-182242 A | 8/2008 |
| JP | 2010-153666 A | 7/2010 |
| JP | 2010-186896 A | 8/2010 |
| JP | 2010-251493 A | 11/2010 |
| JP | 2011-103437 A | 5/2011 |
| JP | 3168024 U | 5/2011 |
| JP | 2011-192683 A | 9/2011 |
| JP | 2011-233928 A | 11/2011 |
| JP | 2012-028699 A | 2/2012 |
| JP | 2012-039162 A | 2/2012 |
| JP | 2013-030561 A | 2/2013 |
| JP | 2013-051296 A | 3/2013 |
| JP | 2013-077813 A | 4/2013 |
| JP | 2013-161903 A | 8/2013 |
| JP | 2013-183013 A | 9/2013 |
| JP | 2013-239708 A | 11/2013 |
| JP | 2014-041966 A | 3/2014 |
| JP | 2014-203889 A | 10/2014 |
| JP | 2015-005584 A | 1/2015 |
| JP | 2015-226063 A | 12/2015 |
| WO | 2002-061835 A1 | 8/2002 |
| WO | 2014-030530 A1 | 2/2014 |

OTHER PUBLICATIONS

Restriction Requirement in the parent U.S. Appl. No. 15/471,095 dated Jan. 16, 2018.
Non Final Office Action in the parent U.S. Appl. No. 15/471,095 dated May 10, 2018.
Final Office Action in the parent U.S. Appl. No. 15/471,095 dated Nov. 2, 2018.
Advisory Action in the parent U.S. Appl. No. 15/471,095 dated Feb. 8, 2019.
Notice of Allowance in the parent U.S. Appl. No. 15/471,095 dated Apr. 4, 2019.

* cited by examiner

METHOD FOR MANUFACTURING LEAD FRAME INCLUDING ELECTRODE AND HANGER LEAD, METHOD FOR MANUFACTURING PACKAGE HAVING LEAD FRAME, AND METHOD FOR MANUFACTURING LIGHT-EMITTING DEVICE HAVING PACKAGE

CROSS-REFERENCE TO RELATED APPLICATIONS

This application is a divisional application of U.S. patent application Ser. No. 15/471,095 filed on Mar. 28, 2017. The present application claims priority under 35 U.S.C. § 119 to Japanese Patent Application No. 2016-071684, filed Mar. 31, 2016. The contents of U.S. patent application Ser. No. 15/471,095 and Japanese Patent Application No. 2016-071684 are incorporated herein by reference in their entirety.

BACKGROUND OF THE INVENTION

1. Field of the Invention

The present invention relates to a lead frame, a package, and a light-emitting device, and methods for manufacturing them.

2. Description of Related Art

Conventionally known light-emitting devices include lead frames including hanger leads, packages using the lead frames, and semiconductor light-emitting elements mounted on the packages (for example, Japanese Utility Model Registration No. 3168024).

The packages are formed, for example, by performing resin molding on the lead frames in which a plurality of pairs of electrodes and the hanger leads are connected to outer frames. The electrodes are supported by supporting members made of resin. The supporting members are each supported by a plurality of hanger leads connected to the outer frame of the lead frame on the side surfaces. The packages have constitutions that prevent the packages from being separated at the time the electrodes are separated from the outer frames. Accordingly, bunches of packages are formed so that in each bunch a plurality of packages will be connected to the outer frame through the hanger leads.

Individual packages can be detached from the bunch by pressing the packages in a direction perpendicular to the outer frame surface of the lead frame to separate the supporting members from the hanger leads.

SUMMARY OF THE INVENTION

A method for manufacturing a lead frame according to an embodiment of the present disclosure includes punching a metal plate disposed on a die with a punch in a direction from the metal plate toward a die side to form a punched metal, the punched metal including at least one electrode, at least one hanger lead separated from the at least one electrode, and an outer frame connected to the at least one electrode and the at least one hanger lead, and stamping at least a part of a corner of an end of the at least one hanger lead, the corner being on a side corresponding to the die side, with a vertically split mold to form at least one chamfered surface.

A method for manufacturing a lead frame according to an embodiment of the present disclosure includes disposing a metal plate on a die, punching the metal plate with a punch in a direction from the metal plate toward a die side to form at least one electrode and at least one hanger lead separated from the at least one electrode, and performing stamping to chamfer at least a part of a corner of an end of the at least one stamped hanger lead, the corner being on a side corresponding to the die side.

A method for manufacturing a lead frame according to an embodiment of the present disclosure includes punching a metal plate from a lower direction toward an upper direction to form a punched metal, the punched metal including at least one electrode, at least one hanger lead separated from the at least one electrode, and an outer frame connected to the at least one electrode and the at least one hanger lead, and stamping at least a part of a corner of an end of the at least one hanger lead, the corner being on an upper side of the punched metal, with a vertically split mold to form at least one chamfered surface. The upper side is the side of the upper surface of the metal plate, and the lower side is the side of the lower surface of the metal plate at the time the metal plate is incorporated in the package or the light-emitting device as the lead frame.

A method for manufacturing a package according to an embodiment of the present disclosure includes performing any of the above methods for manufacturing a lead frame to form the lead frame, sandwiching the at least one electrode between an upper mold and a lower mold of a vertically split mold for molding, injecting a first resin into the mold for molding sandwiching the at least one electrode, and solidifying or curing the injected first resin to form the supporting member.

A method for manufacturing a light-emitting device according to an embodiment of the present disclosure includes performing the above method for manufacturing a package to form the package and mounting the light-emitting element in the depression.

A lead frame, a package, and a light-emitting device, and methods for manufacturing them according to an embodiment of the present disclosure can provide a package and a light-emitting device that can be detached by pressing them downward with respect to the lead frame and are not likely to fall off the lead frame.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

DETAILED DESCRIPTION OF EMBODIMENTS

Figure 1:
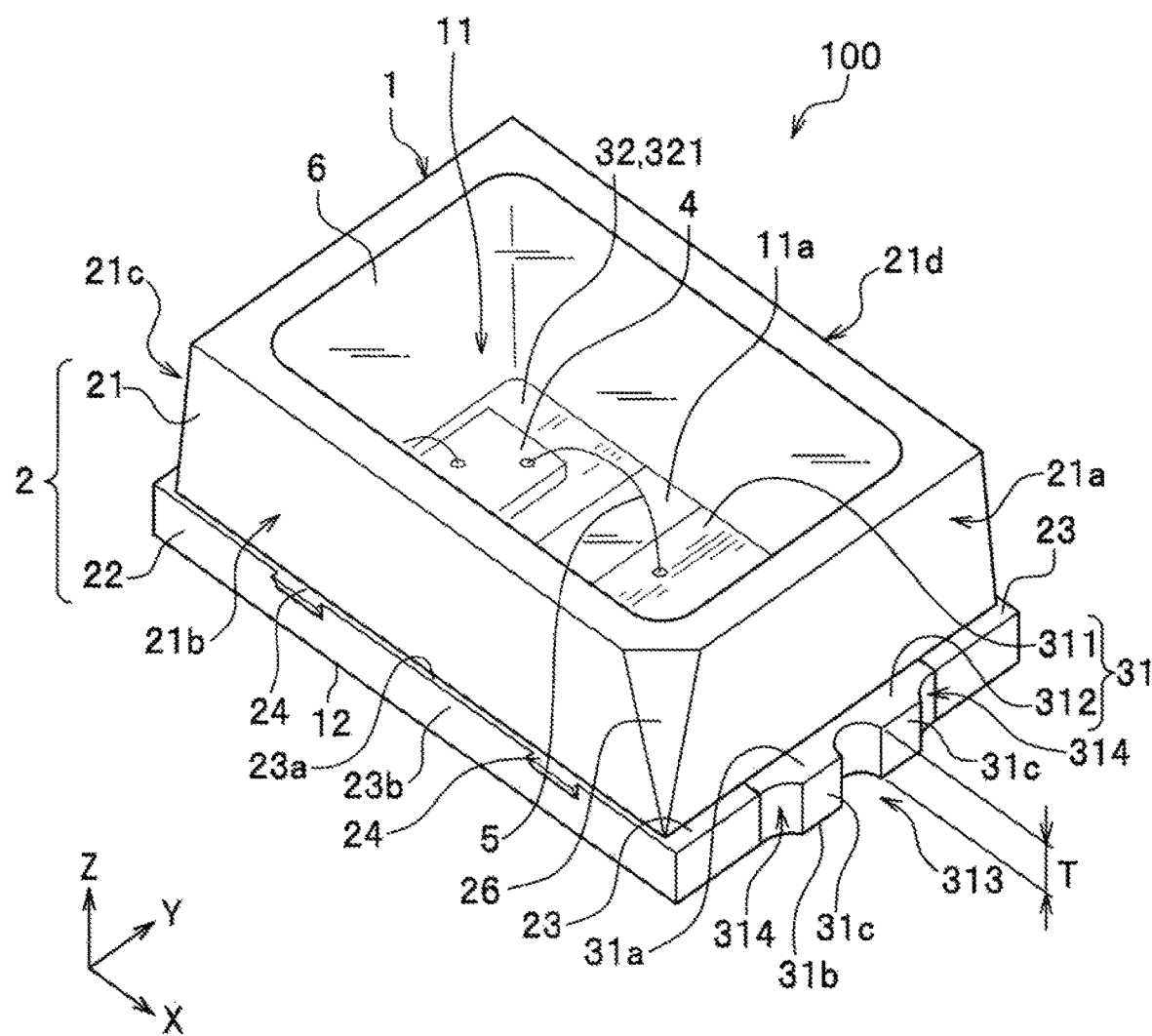
FIG. 1 is a schematic perspective diagram illustrating a constitution of a light-emitting device according to an embodiment.

The embodiments will now be described with reference to the accompanying drawings, wherein like reference numerals designate corresponding or identical elements throughout the various drawings.

The following describes a lead frame, a package, and a light-emitting device, and methods for manufacturing them according to an embodiment. The drawings referred to in the description below schematically illustrate the present embodiment. The scales, the distances, the positional relations, and the like of members may be exaggerated, or illustration of part of the members may be omitted in some cases. In the description below, the same term or reference number represents the same or homogenous member in principle, and its detailed description will be omitted as appropriate. An "outer side surface" means a "side surface on the outer side of a wall portion", and an "inner side surface" means a "side surface on the inner side of a wall portion".

For the purpose of illustration, the directions of observation are represented by the XYZ coordinate system in each drawing.

[Constitution of Light-Emitting Device]

A constitution of the light-emitting device according to the embodiment will be described referring to FIG. 1 to FIG. 2E.

Figure 2A:
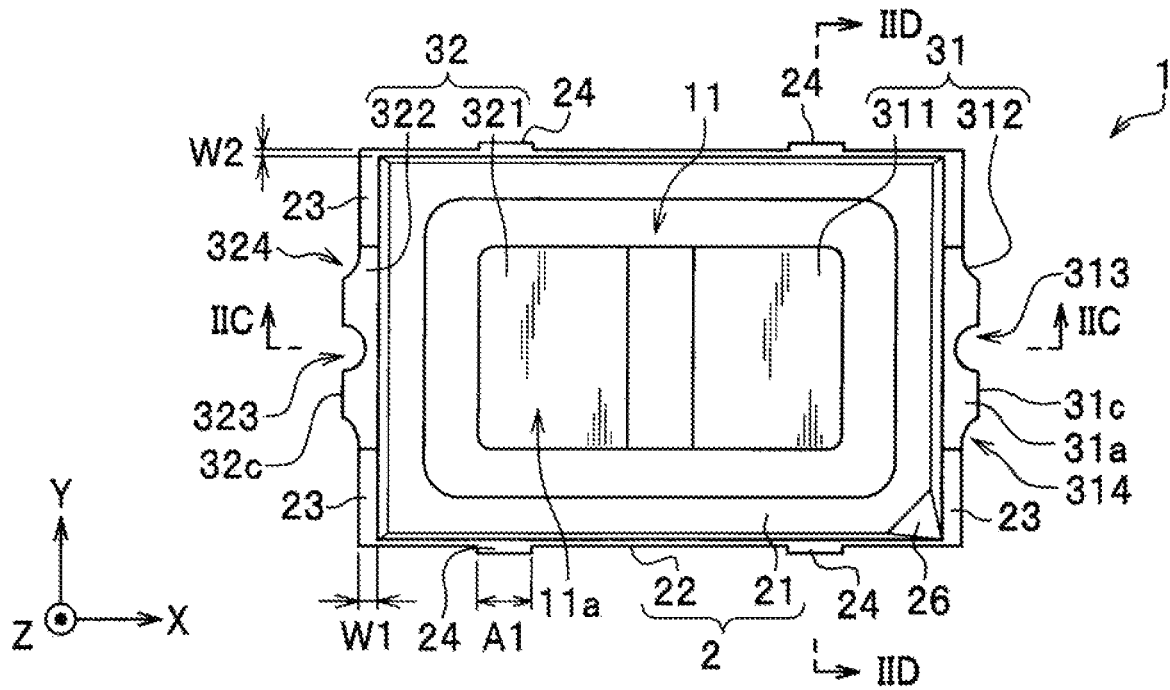
FIG. 2A is a schematic plan diagram illustrating a constitution of a package according to the embodiment.
Figure 2B:
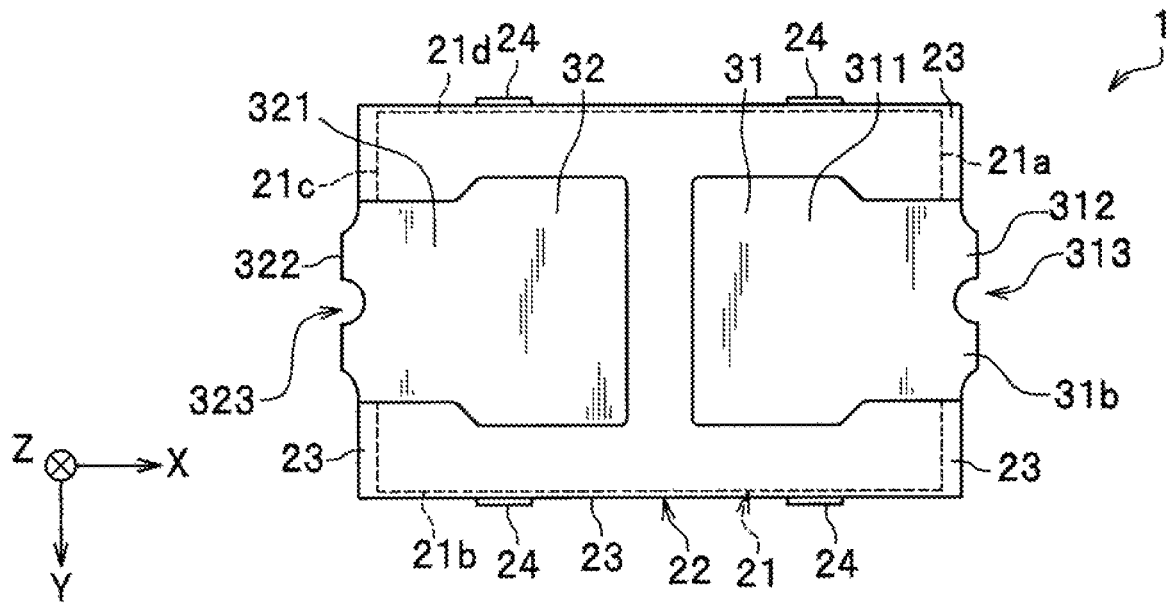
FIG. 2B is a schematic bottom diagram illustrating the constitution of the package according to the embodiment.
Figure 2C:
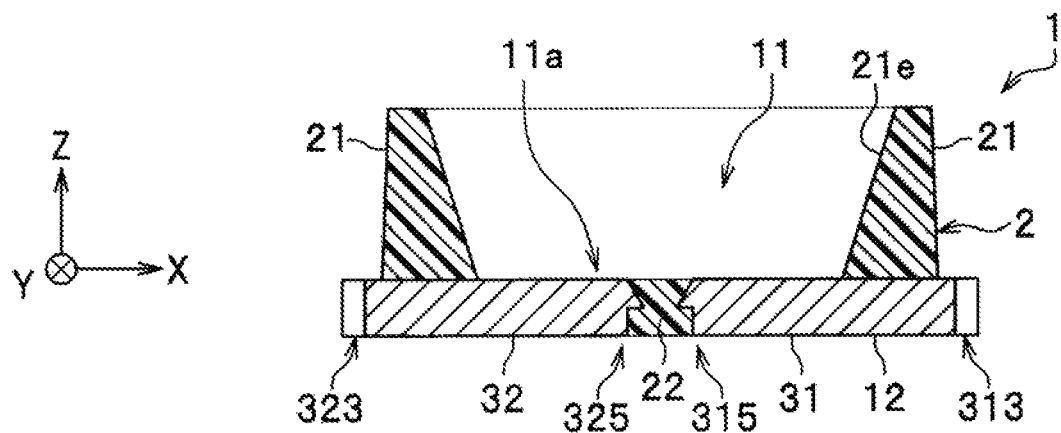
FIG. 2C is a schematic cross-sectional diagram illustrating the constitution of the package according to the embodiment taken along the line IIC-IIC in FIG. 2A.
Figure 2D:
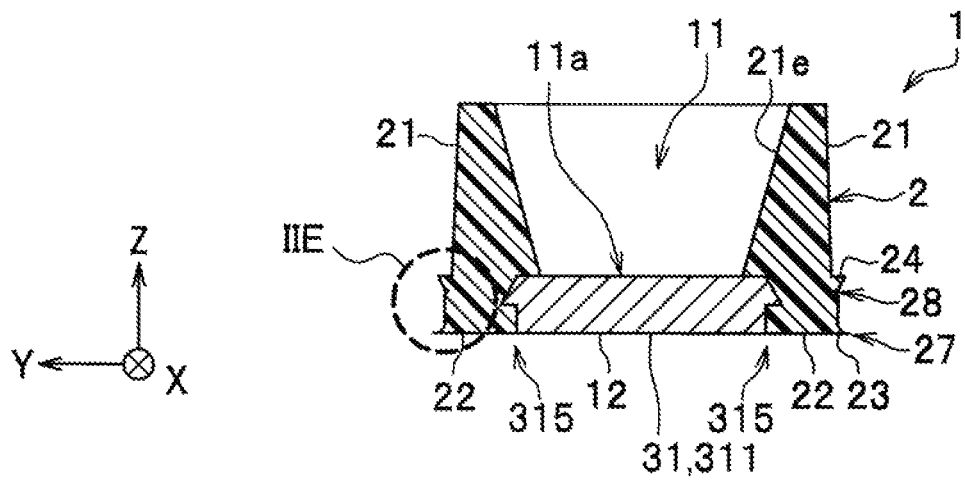
FIG. 2D is a schematic cross-sectional diagram illustrating the constitution of the package according to the embodiment taken along the line IID-IID in FIG. 2A.
Figure 2E:
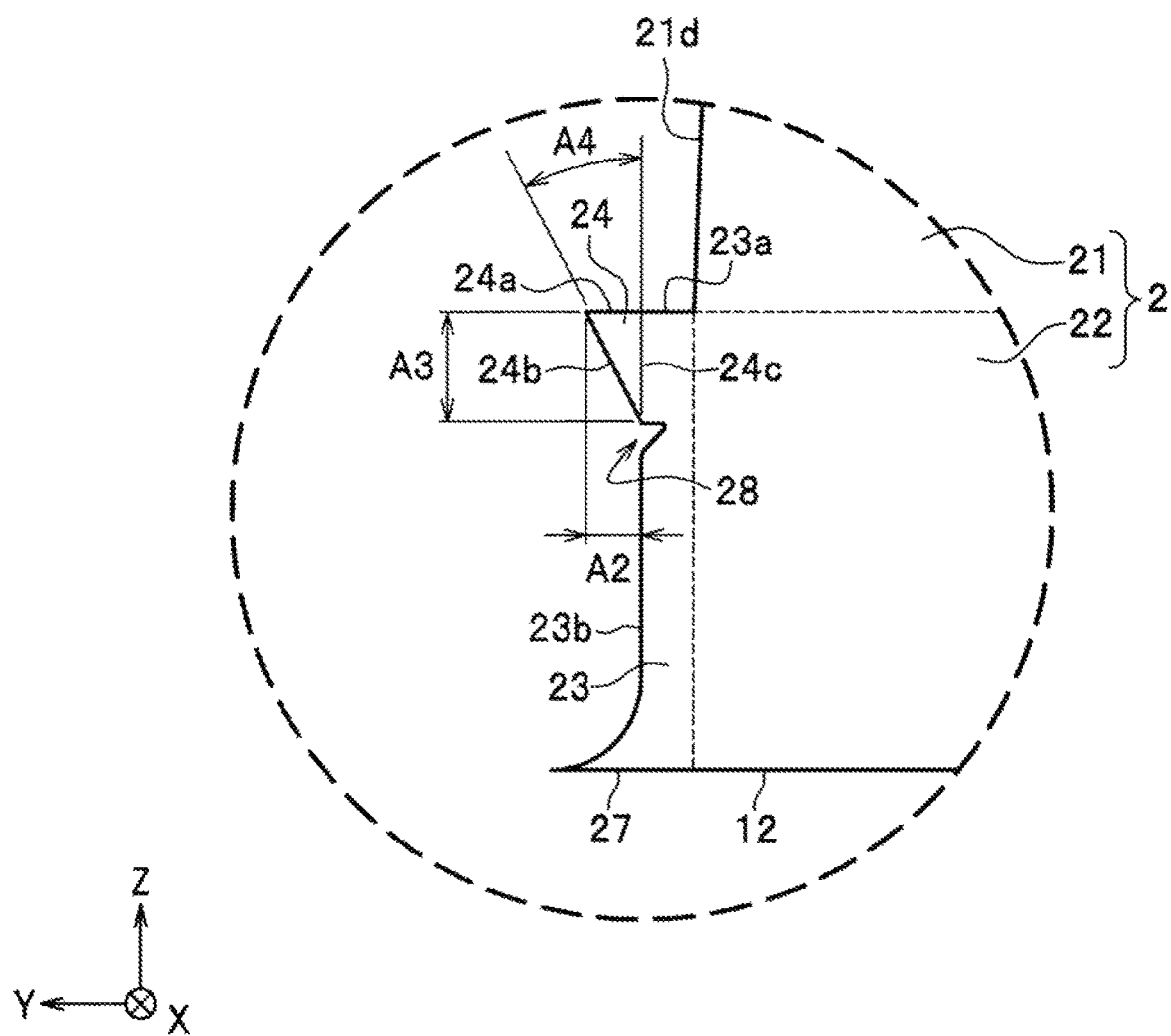
FIG. 2E is a schematic cross-sectional diagram illustrating the constitution of the package according to the embodiment and showing a partial enlarged view of the region IIE enclosed by the dashed line in FIG. 2D.

FIG. 1 is a schematic perspective diagram illustrating the constitution of the light-emitting device according to the embodiment. FIG. 2A is a schematic plan diagram illustrating a constitution of the package according to the embodiment. FIG. 2B is a schematic bottom diagram illustrating the constitution of the package according to the embodiment. FIG. 2C is a schematic cross-sectional diagram illustrating the constitution of the package according to the embodiment taken along the line IIC-IIC in FIG. 2A. FIG. 2D is a schematic cross-sectional diagram illustrating the constitution of the package according to the embodiment taken along the line IID-IID in FIG. 2A. FIG. 2E is a schematic cross-sectional diagram illustrating the constitution of the package according to the embodiment and showing a partial enlarged view of the region IIE enclosed by the dashed line in FIG. 2D.

A light-emitting device 100 according to the embodiment includes a package 1 having a depression 11, a light-emitting element 4 mounted in the depression 11, and a sealing member (second resin) 6 covering the light-emitting element 4.

The package 1 has an approximately rectangular-cuboid overall shape and is formed into a box shape having the depression 11 that is open on the upper side. The box shape herein is a hollow shape. In the present embodiment, the package 1 has a cupped shape that is open on the upper side. The cupped shape that is open on the upper side is an approximate quadrilateral having rounded corners in a plan view, but the shape may be a circle, an ellipse, a polygon, or an approximate quadrilateral having angular corners. The package 1 includes a first electrode 31, a second electrode 32 having the polarity different from the polarity of the first electrode 31, and a supporting member 2 that is a resin molding supporting the first electrode 31 and the second electrode 32.

The package 1 has a mark 26 indicating the polarity of the first electrode 31. The mark 26 is a cut-out or depressed vertex of the approximately rectangular-cuboid outer shape of the package 1. The shape, the size, and the location of the mark 26 are not particularly limited. For example, the mark 26 may be disposed on the second electrode 32 side.

The depression 11 is a cavity in which the light-emitting element 4 is to be mounted. The depression 11 is open on the upper side and is defined by side walls mainly made of the supporting member 2 and a bottom surface 11a at least partially made of the first electrode 31 and the second electrode 32.

More particularly, the sides of the depression 11 are surrounded by a wall portion 21 of the supporting member 2, and the bottom surface 11a is constituted of an inner-lead portion 311 of the first electrode 31, an inner-lead portion 321 of the second electrode 32, and the supporting member 2. The depression 11 becomes wider toward the opening direction (positive direction of the Z axis). The lower surfaces of the first electrode 31 and the second electrode 32 are exposed on a lower surface 12 of the package 1. The lower surface 12 is a mounting surface in mounting the package 1 on an external mounting board or the like. The lower surfaces of the first electrode 31 and the second electrode 32 are approximately flush with the lower surface of the supporting member 2. That is, the lower surface 12 of the package 1 is flat. The term "approximately flush" herein includes the case where surfaces are substantially flush with each other in addition to the case where surfaces are physically flush with each other. For example, in the case where a level difference is equal to or less than 10%, more preferably equal to or less than 5%, of the thickness of an electrode, surfaces on both sides of the level difference are approximately flush with each other.

In each drawing, the coordinate axes are defined so that the lower surface 12, which is the mounting surface, of the package 1 will be parallel to the X-Y plane. A first direction in which an end of the first electrode 31 and an end of the second electrode 32 face each other is the X-axis direction, and a second direction perpendicular to the first direction in a plane parallel to the mounting surface is the Y-axis direction. The height direction, which is perpendicular to the mounting surface, of the package 1 is the Z-axis direction.

The supporting member 2 includes the wall portion 21, which is an upper layer, and a bottom portion 22, which is a lower layer. The supporting member 2 can be formed by molding a resin material.

The wall portion 21 constitutes the side walls of the depression 11. The wall portion 21 has an outer side surface 21a, an outer side surface 21b adjacent to the outer side surface 21a, an outer side surface 21c adjacent to the outer side surface 21b and facing the outer side surface 21a, and an outer side surface 21d adjacent to the outer side surface 21a and the outer side surface 21c. The outer side surfaces 21a, 21b, 21c, and 21d are inclined inward toward the upper direction (positive direction of the Z axis). The outer side surfaces 21a, 21b, 21c, and 21d may be perpendicular surfaces but are preferably inclined inward so that a molding can be easily removed from a mold in the case where the supporting member 2 is molded.

An inner side surface 21e of the wall portion 21 that is the side walls constituting the side surfaces of the depression 11 is inclined outward from the bottom surface 11a toward the opening. The inner side surface 21e may be a perpendicular surface but is preferably inclined outward. Since the inner side surface 21e is inclined outward, light that is emitted from the light-emitting element mounted in the depression 11 and propagates laterally can be reflected toward the opening direction to enhance the light extraction efficiency. In addition, a molding can be easily removed from a mold in the case where the supporting member 2 is molded. The inner side surface 21e may be a stepped surface.

The bottom portion 22 has a thickness T that is the same as the thicknesses of the first electrode 31 and the second electrode 32. The first electrode 31 and the second electrode 32 are secured to the bottom portion 22. The bottom portion 22 has a flange 23 around the wall portion 21. The flange 23 protrudes outward beyond the wall portion 21 in a plan view.

The lower surface of the bottom portion 22 is approximately flush with the lower surfaces of the first electrode 31 and the second electrode 32, in other words, the lower surfaces are in the same plane. Thus, the lower surface 12, which is the mounting surface, of the package 1 is flat. The term "approximately flush" herein includes the case where surfaces are substantially flush with each other in addition to the case where surfaces are physically flush with each other. For example, in the case where a level difference is equal to or less than 10%, more preferably equal to or less than 5%, of the thickness of the first electrode 31, surfaces on both sides of the level difference are approximately flush with each other.

The wall portion 21 and the bottom portion 22 are integrally formed of the same material. Such integral forming can enhance the connecting strength between the wall portion 21 and the bottom portion 22.

The flange 23 is disposed as the outer periphery of the bottom portion 22 and has the thickness T that is the same as the thicknesses of the first electrode 31 and the second electrode 32. The flange 23 protrudes outward beyond the wall portion 21 in a plan view. Side surfaces 23b, which are side surfaces of the bottom portion 22, of the flange 23 include surfaces approximately perpendicular to the lower surface 12 of the package 1.

The flange 23 is disposed on end surfaces 31c and 32c, the entire region of the long sides of the outer shape of the wall portion 21, and regions in which outer-lead portions 312 and 322 are not disposed on the short sides of the outer shape of the wall portion 21 in a plan view. In other words, the flange 23 is not disposed on the side surfaces of dents 313, 314, 323, and 324 of the outer-lead portions 312 and 322.

In the package 1, the first electrode 31 protrudes from the outer side surface 21a, and the second electrode 32 protrudes from the outer side surface 21c. The first electrode 31 and the second electrode 32 are not exposed from the outer side surfaces 21b and 21d. In other words, the outer side surfaces 21b and the 21d are entirely formed of the same material as for the wall portion 21, that is, a resin material. Accordingly, in the case where the package 1 is, for example, soldered to an external mounting board solder leakage onto the outer side surfaces 21b and 21d can be reduced by the low solder wettability.

In a plan view, a projecting quantity W1 indicates how much the flange 23 is protruding from the outer side surfaces 21a and 21c of the wall portion 21 in the longitudinal direction (X-axis direction) of the package 1, and a projecting quantity W2 indicates how much the flange 23 is protruding from the outer side surfaces 21b and 21d in the short direction (Y-axis direction) of the package 1.

The projecting quantity W1 is preferably equal to or more than 5 μm. In the case where the dents 313, 314, 323, and 324 are disposed on the ends of the outer-lead portions 312 and 322 of the first electrode 31 and the second electrode 32, for example, the projecting quantity W1 is particularly preferably about 20 μm.

The projecting quantity W2 is preferably equal to or more than 5 μm. To prevent the outer side surfaces 21b and 21d from being damaged by contact with hanger leads 35 during removal from the hanger leads 35 in the manufacturing procedure (see FIG. 11 and FIG. 12), for example, the projecting quantity W2 is preferably equal to or more than 10 μm particularly preferably equal to or more than 20 μm.

The projecting quantity W1 and the projecting quantity W2 of the flange 23 may be the same or may be different.

Portions of the flange 23 extending in the longitudinal direction of the supporting member 2 in a plan view, that is, portions of the flange 23 continuous with the lower ends of the outer side surfaces 21b and 21d of the wall portion 21 include projections 24 on part of the corners on their upper surface 23a side. In addition, grooves 28 are formed continuous with the lower ends of the projections 24. Resin burrs 27 protruding outward from the side surfaces 23b in a plan view are formed at the lower end of the flange 23 along the longitudinal direction of the supporting member 2 in a plan view.

The projections 24, the grooves 28, and the resin burrs 27 derive from the end shape of the hanger leads 35 (see FIG. 8D) of a lead frame 3 in forming the supporting member 2 by molding, which will be described later in detail.

The projections 24 protrude from the side surfaces 23b of the flange 23 extending along the longitudinal direction of the supporting member 2 in a plan view. In the present embodiment, the two side surfaces 23b of the flange 23 extending along the longitudinal direction of the supporting member 2 each include two projections 24. It is preferable that equal to or more than two projections 24 be disposed on each of the two side surfaces 23b of the flange 23.

The cross-sectional shape of each of the projections 24 in a plane (plane parallel to the Y-Z plane) perpendicular to the lower surface 12 of the package 1 and the side surface of the flange 23 is an approximate right triangle. In the right triangle, which is the cross-sectional shape of the projection 24, one of the sides adjacent to the right angle corresponds to a connecting surface 24c connected to the flange 23 and is within the perpendicular plane that is the side surface 23b of the bottom portion 22 of the supporting member 2. The other one of the sides adjacent to the right angle corresponds to the upper surface 24a of the projection 24 and is approximately flush with the upper surface 23a of the flange 23. The upper surface 23a of the flange 23 is approximately flush with the upper surfaces of the first electrode 31 and the second electrode 32. The hypotenuse of the right triangle corresponds to a side surface 24b of the projection 24 and becomes inclined outward toward the upper direction. In other words, the side surface 24b is a downward inclined surface. The term "approximately flush" herein includes the case where surfaces are substantially flush with each other in addition to the case where surfaces are physically flush with each other. For example, in the case where a level difference is equal to or less than 10%, more preferably equal to or less than 5%, of the thickness of an electrode, surfaces on both sides of the level difference are approximately flush with each other.

Forming the cross-sectional shape of the projection into a right triangle can enhance the holding force of the hanger leads 35 for the package 1 while facilitating detachment of the package 1 from the hanger leads 35.

Herein, a width (length in the X-axis direction) A1 of the projection 24 indicates its length in the extending direction, a projecting quantity (length in the Y-axis direction) A2 indicates how much the projection 24 is protruding from the perpendicular side surface 23b of the flange 23, a height (length in the Z-axis direction) A3 indicates the height of the projection 24, and an inclined angle A4 indicates how much the side surface 24b is inclined from the perpendicular.

The width A1 is preferably equal to or more than 1/20 and equal to or less than 1/1, more preferably equal to or more than 1/10 and equal to or less than 1/2 of the length (length in the X-axis direction) of the side surface 23b of the bottom portion 22 on which the projection 24 is disposed. More specifically, the width A1 is preferably equal to or more than about 200 μm and equal to or less than about 1000 μm.

In the case where a plurality of projections 24 are disposed on each side surface 23b, the total width of the projections 24 is preferably within the above range of the width A1.

The projecting quantity A2 is preferably equal to or more than about 1/20 and equal to or less than about 1/4 of the thickness T of the first electrode 31 and the second electrode 32, that is, the thickness (length in the Z-axis direction) of the bottom portion 22. More specifically, the projecting quantity A2 is preferably equal to or more than about 10 μm and equal to or less than about 50 μm.

The height A3 is preferably equal to or more than about 1/10 and equal to or less than about 1/2 of the thickness T of the first electrode 31 and the second electrode 32, that is, the thickness (length in the Z-axis direction) of the bottom portion 22. More specifically, the height A3 is preferably equal to or more than about 20 μm and equal to or less than about 100 μm.

The inclined angle A4 may be equal to or more than 45° but is preferably equal to or more than 15° and less than 45°, more preferably 30° or its adjacent values.

Figure 8A:
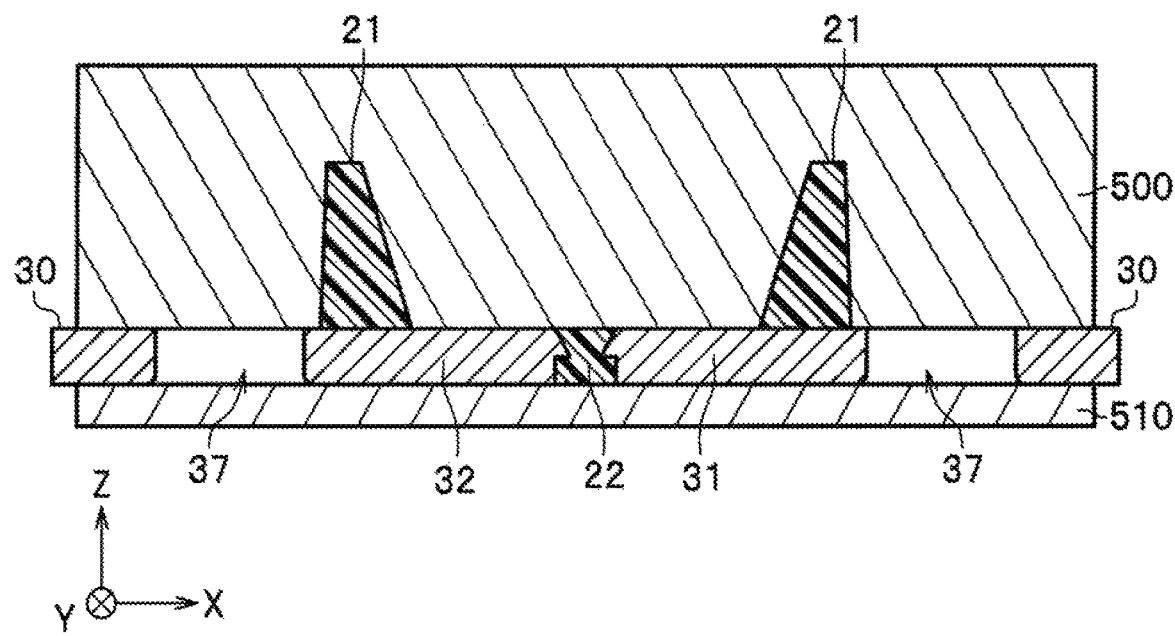
FIG. 8A is a schematic cross-sectional diagram illustrating a step of injecting a first resin in the step of forming the supporting member in the method for manufacturing the light-emitting device according to the embodiment at a position corresponding to the line VIIB-VIIB in FIG. 7A.
Figure 8B:
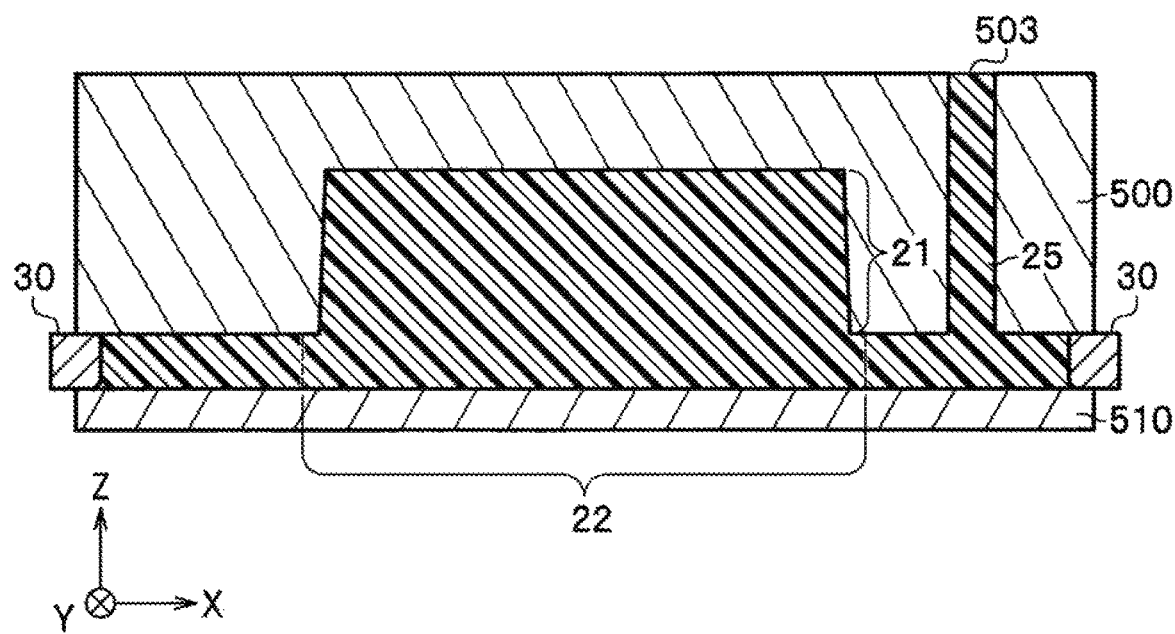
FIG. 8B is a schematic cross-sectional diagram illustrating the step of injecting the first resin in the step of forming the supporting member in the method for manufacturing the light-emitting device according to the embodiment at a position corresponding to the line VIIC-VIIC in FIG. 7A.
Figure 8C:
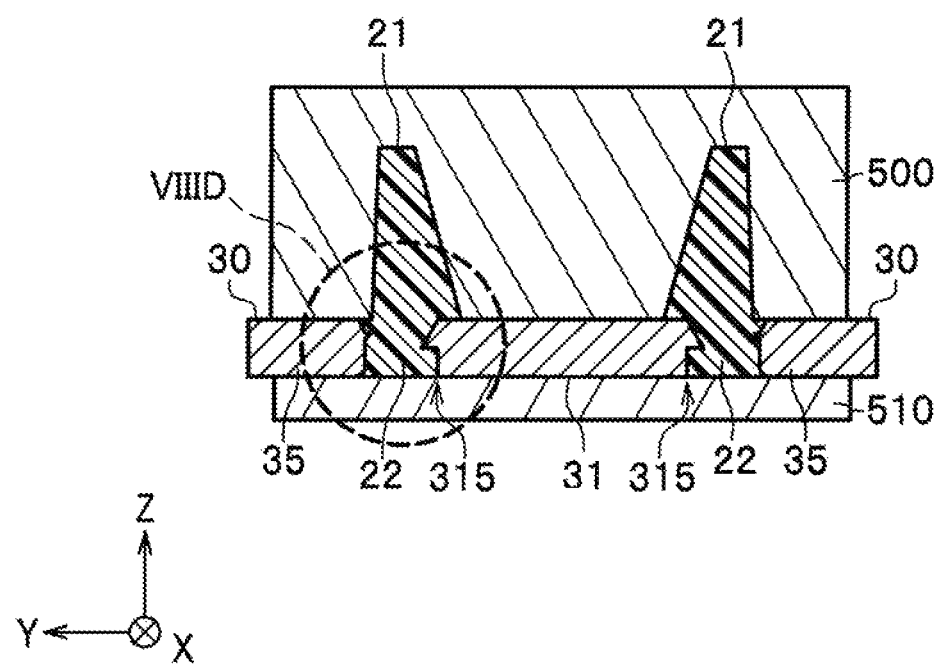
FIG. 8C is a schematic cross-sectional diagram illustrating the step of injecting the first resin in the step of forming the supporting member in the method for manufacturing the light-emitting device according to the embodiment at a position corresponding to the line VIID-VIID in FIG. 7A.
Figure 8D:
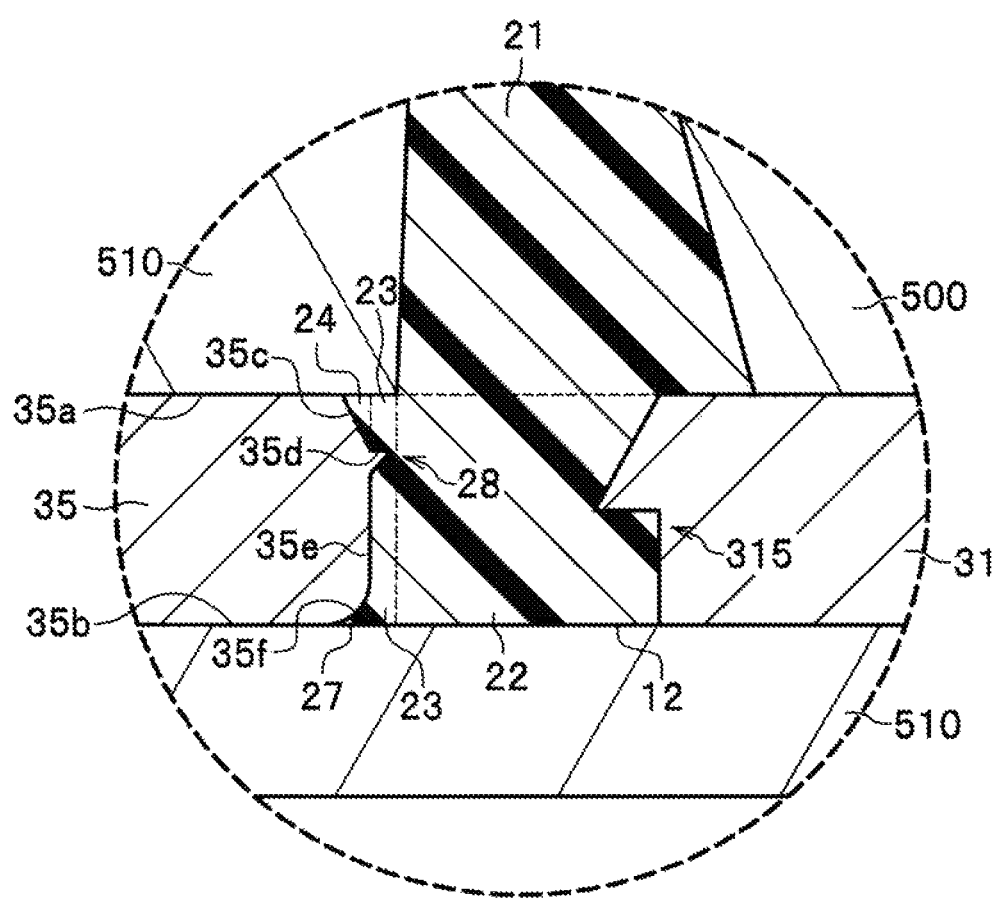
FIG. 8D is a schematic cross-sectional diagram illustrating the step of injecting the first resin in the step of forming the supporting member in the method for manufacturing the light-emitting device according to the embodiment and showing a partial enlarged view of the region VIIID enclosed by the dashed line in FIG. 8C.

Setting the parameters (A1 to A4) of the shape of the projection 24 in the above ranges enables the package 1 to be held by the hanger leads 35 of the lead frame 3 with an appropriate holding force in the manufacturing procedure (see FIG. 8D). Herein, the lower limit of the appropriate holding force is such a degree that is large enough to prevent the package 1 from accidentally falling off the hanger leads 35 at the time the lead frame 3 is handled. The upper limit is such a degree that is small enough to prevent practical troubles such as detachment of the first electrode 31 and the second electrode 32 from the supporting member 2 at the time of separating the package 1 from the hanger leads 35 by pressing the package 1 from the upper side.

The groove 28 is formed continuous with the lower end of the side surface 24*b* of the projection 24. The groove 28 is formed correspondingly to the end shape of the hanger leads 35 that hold the package in the manufacturing procedure (see FIG. 8D).

The groove 28 may not be formed but is preferably formed. The supporting member 2 is formed so that a projecting portion 35*d* on the end of the hanger lead 35 will fit into the groove 28, thereby making it difficult for the package 1 to fall off the lead frame 3 also in the upper direction.

The groove 28 is preferably equal to or more than about 1 μm and equal to or less than about 15 μm in depth (length in the Y-axis direction) and equal to or more than about 1 μm and equal to or less than about 15 μm in height (length in the Z-axis direction). The groove 28 preferably has a width (length in the X-axis direction) equal to the width of the projection 24.

The resin burr 27 derives from stamping in which the lower side of the hanger lead 35 is used as the rollover surface.

A shorter resin burr 27 is more preferable. The protruding length of the resin burr 27 from the side surface 23*b* of the flange 23 is preferably smaller than about half the thickness of the lead frame 3, that is, the thickness T of the first electrode 31 and the second electrode 32.

Examples of a resin material (first resin) used for the supporting member 2 include thermoplastic resins and thermosetting resins.

Examples of thermoplastic resins include polyphthalamide resin, liquid crystal polymers, poly(butylene terephthalate) (PBT), and unsaturated polyesters. With these materials, a package can be manufactured in a simple way at low cost. In addition, since the resulting package is softer than ceramics, fracturing and chipping can be suppressed.

Examples of thermosetting resins include epoxy resins, modified epoxy resins, silicone resins, and modified silicone resins. With these materials, a package having a good heat resistance ran be manufactured in a simple way.

To efficiently reflect light on the inner side surface 21*e* of the wall portion 21 of the supporting member 2, the supporting member 2 may contain particles of a light-reflective substance. Examples of the light-reflective substance include white fillers such as titanium oxide, glass fillers, silica, alumina, and zinc oxide. These materials have high light-reflectances on the outer surfaces in the case where the materials are contained in the resin material. The visible reflectance of the inner side surface 21*e* is preferably equal to or more than 70%, more preferably equal to or more than 80%. In particular, the reflectance in the wavelength range of light emitted from the light-emitting element is preferably equal to or more than 70%, more preferably equal to or more than 80%. The content of the light-reflective substance in the resin material is equal to or more than 5% by mass and equal to or less than 50% by mass, preferably equal to or more than 10% by mass and equal to or less than 30% by mass, but these numbers are not limiting.

The first electrode 31 includes the inner-lead portion 311 disposed in the region in which the wall portion 21 of the supporting member 2 is disposed and inside the region and the outer-lead portion 312 disposed outside the wall portion 21 in a plan view.

The second electrode 32 has the same shape as the first electrode 31 and is approximately line-symmetric about the center line (line parallel to the Y axis) in the X-axis direction in a plan view.

The first electrode 31 and the second electrode 32 have approximately the same thickness except for the outer peripheries of the inner-lead portions 311 and 321.

A metal such as copper, iron, silver, gold, and aluminum or an alloy of these metals can be used for the first electrode 31 and the second electrode 32. A material containing copper as a chief material is preferable in view of the thermal conductivity and the strength.

A material in which a chief material such as copper is plated with a metal such as silver and aluminum is preferable for the first electrode 31 and the second electrode 32. This is because the light reflectance can be improved. In addition, adhesion between the supporting member and the first and second electrodes 31 and 32 can be improved.

The inner-lead portion 311 of the first electrode 31 is disposed in the region inside the outer edge of the wall portion 21 in a plan view and is used for electrically connecting the light-emitting element by at least one of die bonding and bonding with solder or wires. The inner-lead portion 311 has an approximately rectangular shape in a plan view, in which an outer portion in the X-axis direction is smaller in width than the inner portion (central side).

The outer-lead portion 312 of the first electrode 31 protrudes from the outer side surface 21*a* of the supporting member 2 and has the same width as the outer portion of the inner-lead portion 311 in the X-axis direction. The outer-lead portion 312 has the cut-out approximately semicircular dent 313 at the approximate center in the width direction in a plan view and the cut-out approximately quadrantal dents 314 at both ends in the width direction in a plan view. The dent 313 and the dents 314 penetrate through the outer-lead portion 312 in the thickness direction.

The flange 23 having the same thickness as the outer-lead portion 312 is disposed on both sides of the outer-lead portion 312 in the width direction (Y-axis direction).

An upper surface 31*a* and a lower surface 31*b* of the first electrode 31 is plated with a layer or a plurality of layers of a metal such as Ag, Au, and Ni to increase the bondability to at least one of a light-reflective connecting member and an electrically-conductive connecting member such as solder. The end surface 31*c* of the outer-lead portion 312 and the side surfaces of the dents 314 are not plated, while the side surface of the dent 313 is plated. Plating can adjust the shape and the height of the projection.

The metal used for plating may be changed depending on the purpose of the plating, in other words, the region to be plated. For example, Ag may be used for the upper surface 31*a* to enhance the light reflectance as a primary object, and Au may be used for the lower surface 31*b* and the side surface of the dent 313 to enhance the solder bondability or the like as a primary object.

The inner-lead portion 321, the outer-lead portion 322, the dent 323, and the dents 324 of the second electrode 32 are respectively the same as the inner-lead portion 311, the outer-lead portion 312, the dent 313, and the dents 314 of the first electrode 31, and their detailed description is omitted.

The shapes of the dents 313, 314, 323, and 324 can be defined as appropriate.

The first electrode 31 includes a level-difference structure 315 on the outer periphery of the inner-lead portion 311. The lower side of the level-difference structure 315 is depressed in the thickness direction of the first electrode 31. On the upper side of the first electrode 31, the lower portion in the thickness direction protrudes outward beyond the upper portion.

The second electrode 32 also has a level-difference structure 325 similar to the level-difference structure 315 on the outer periphery of the inner-lead portion 321.

By disposing the level-difference structures 315 and 325 in the regions of the first electrode 31 and the second electrode 32 in contact with the supporting member 2, a constitution is provided in which the first electrode 31 and the second electrode 32 are not likely to be separated from the supporting member 2 at the time an external force is applied to the package 1 in a step of singulating to be described later.

While the level-difference structures 315 and 325 are disposed on the entire outer peripheries of the inner-lead portions 311 and 321 of the first electrode 31 and the second electrode 32 in the present embodiment, the level-difference structures 315 and 325 may be also disposed in the regions of the outer-lead portions 312 and 322 in contact with the supporting member 2. The level-difference structures 315 and 325 are only required to be disposed on at least part of the outer peripheries of the first electrode 31 and the second electrode 32 in contact with the supporting member 2 and may be intermittently disposed on the outer peripheries.

The light-emitting element 4 is mounted on the second electrode 32 in the depression 11 of the package 1. The shape, the size, the semiconductor material, and the like of the light-emitting element 4 used herein are not particularly limited. Light having any wavelength can be selected as the emission color of the light-emitting element 4 depending on the intended use. A preferable light-emitting element is made of a nitride semiconductor represented by $In_XAl_YGa_{1-X-Y}N$ ($0 \leq X \leq 1$, $0 \leq Y \leq 1$, $X+Y \leq 1$) that has an emission wavelength in the near-ultraviolet to visible region.

While the light-emitting element 4 has the positive and negative electrodes disposed on the same side and is face-up mounted in the present embodiment, the light-emitting element 4 may be face-down mounted, or the positive and negative electrodes may be disposed on different sides.

Wires 5 are electrically-conductive wiring for electrically connecting electronic components such as the light-emitting element 4 and a protective element to the first electrode 31 and the second electrode 32.

The light-emitting element 4 is electrically connected through the wires 5 to the first electrode 31 and the second electrode 32 disposed on the bottom surface 11*a* of the depression 11.

The sealing member (second resin) 6 covers the light-emitting element 4 mounted in the depression 11 of the package 1 and other components. The sealing member 6 is intended to protect the light-emitting element 4 and other components from external force, dust, water, and the like and to make the heat resistance, the weather resistance, and the light resistance of the light-emitting element 4 and other components better. Examples of the material of the sealing member 6 include transparent materials including thermosetting resins such as silicone resins, epoxy resins, and urea-formaldehyde resins. To impart predetermined functions, a fluorescent material (wavelength conversion substance), a light-reflective substance, a light-diffusing substance, or other fillers may be contained in addition to the above materials. Employing a silicone resin can improve the heat resistance and the light resistance.

In the case where a silicone resin is used for the sealing member 6, the sealing member 6 easily sticks to another light-emitting device or other members because the silicone resin has tackiness. The silicone resin of the sealing member 6 can be prevented from sticking to other members because the light-emitting device is singulated by pushing the light-emitting device off the open side of the depression 11 toward the bottom portion 22 side.

Disposing the sealing member 6 in the depression 11 can enhance the strength of the wall portion 21 of the depression 11.

(Modification)

For example, the package 1 may have a modified constitution as described below.

The first electrode 31 and the second electrode 32 of the package 1 may not have part or all of the dents 313, 314, 323, and 324 on the outer-lead portions 312 and 322. In the case where the outer-lead portions 312 and 322 do not have the dents 314 and 324, the flange 23 may be disposed so that the projecting quantity W1 of the flange 23 will be the same as the length of the outer-lead portions 312 and 322.

The package 1 may not have at least one of the flange 23 and the outer-lead portions 312 and 322 protruding from the wall portion 21.

The package 1 may not have the mark 26.

[Method for Manufacturing Light-Emitting Device]

Next, a method for manufacturing the light-emitting device 100 will be described referring to FIG. 3 to FIG. 12.

Figure 3:
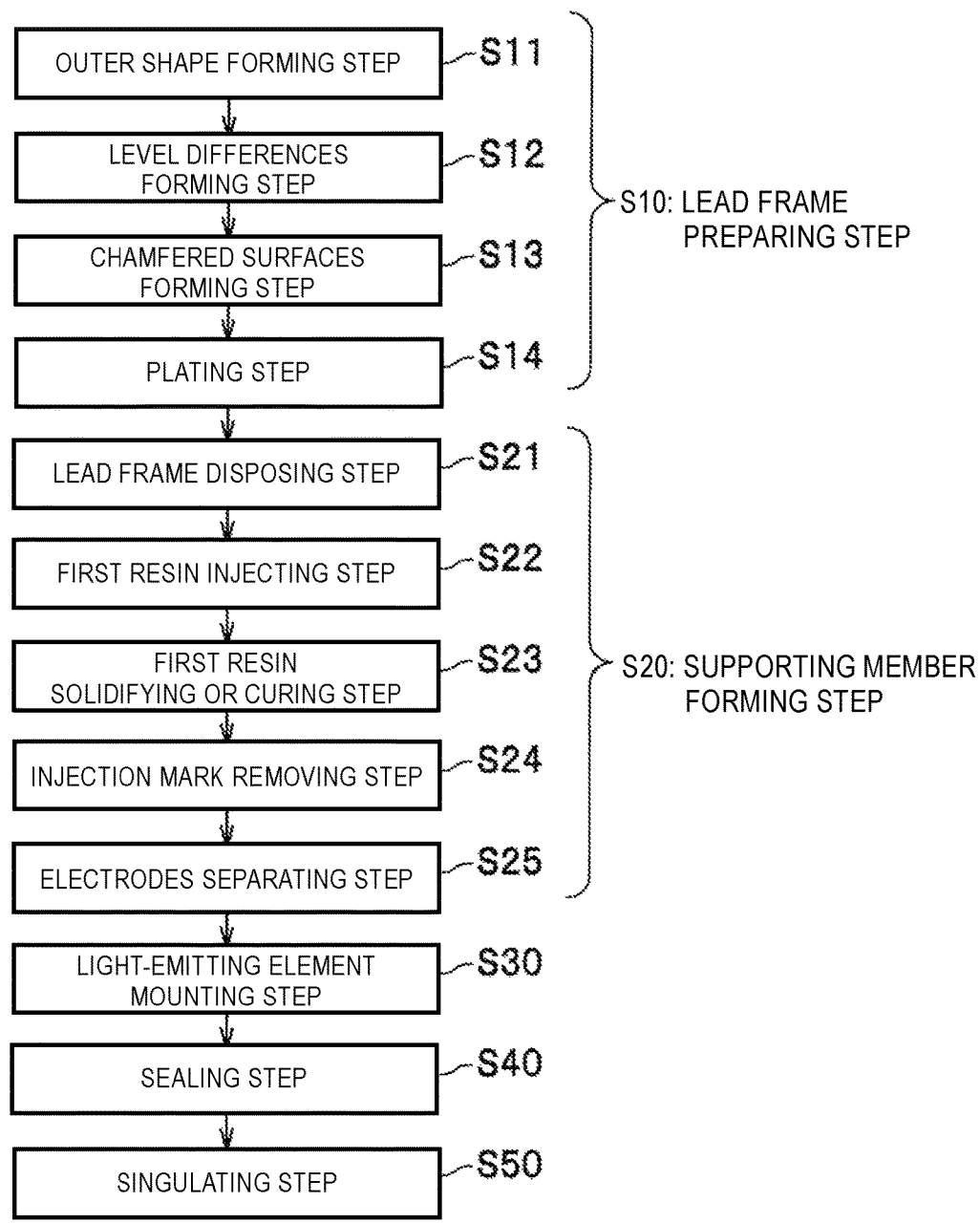
FIG. 3 is a flowchart illustrating a method for manufacturing the light-emitting device according to the embodiment.
Figure 4A:
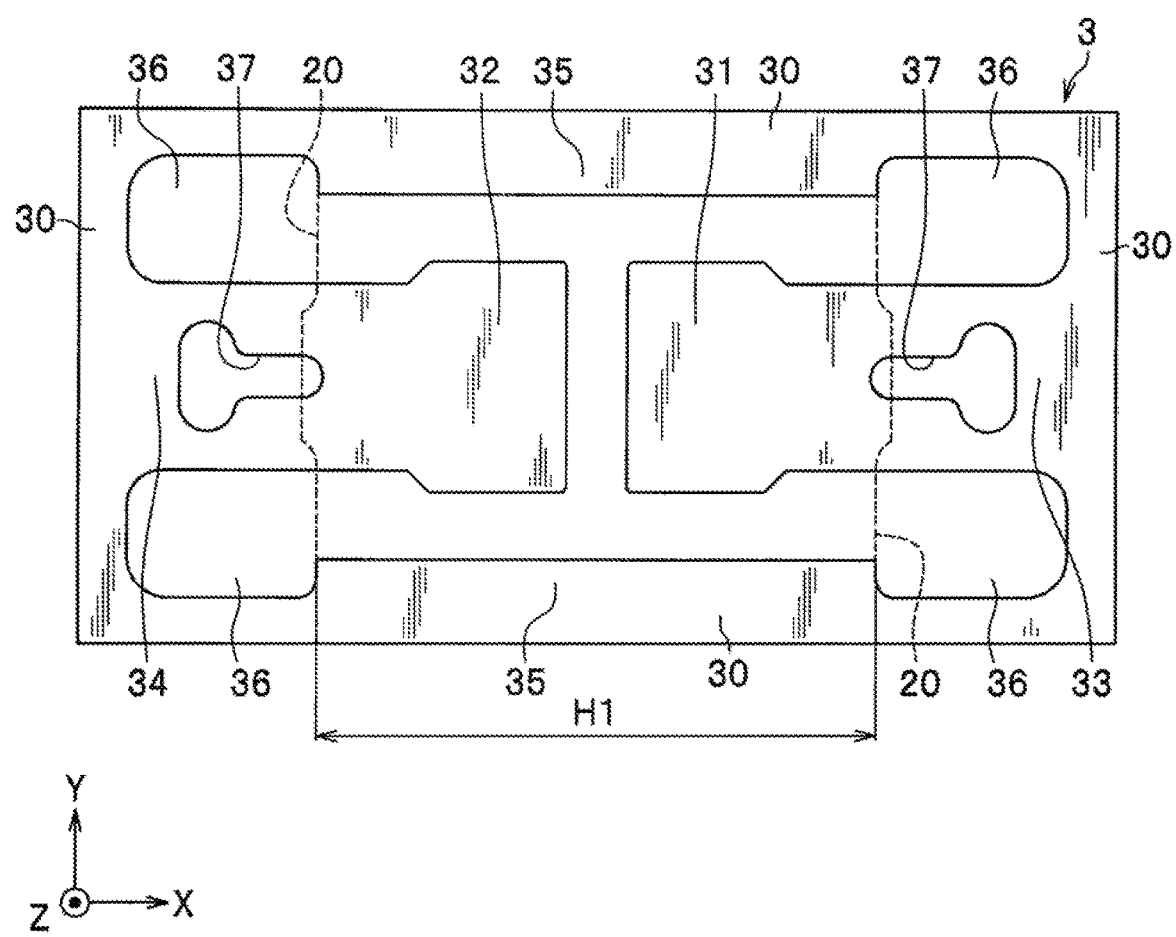
FIG. 4A is a schematic plan diagram illustrating a constitution of a lead frame formed in a step of forming the outer shape in the method for manufacturing the light-emitting device according to the embodiment.
Figure 4B:
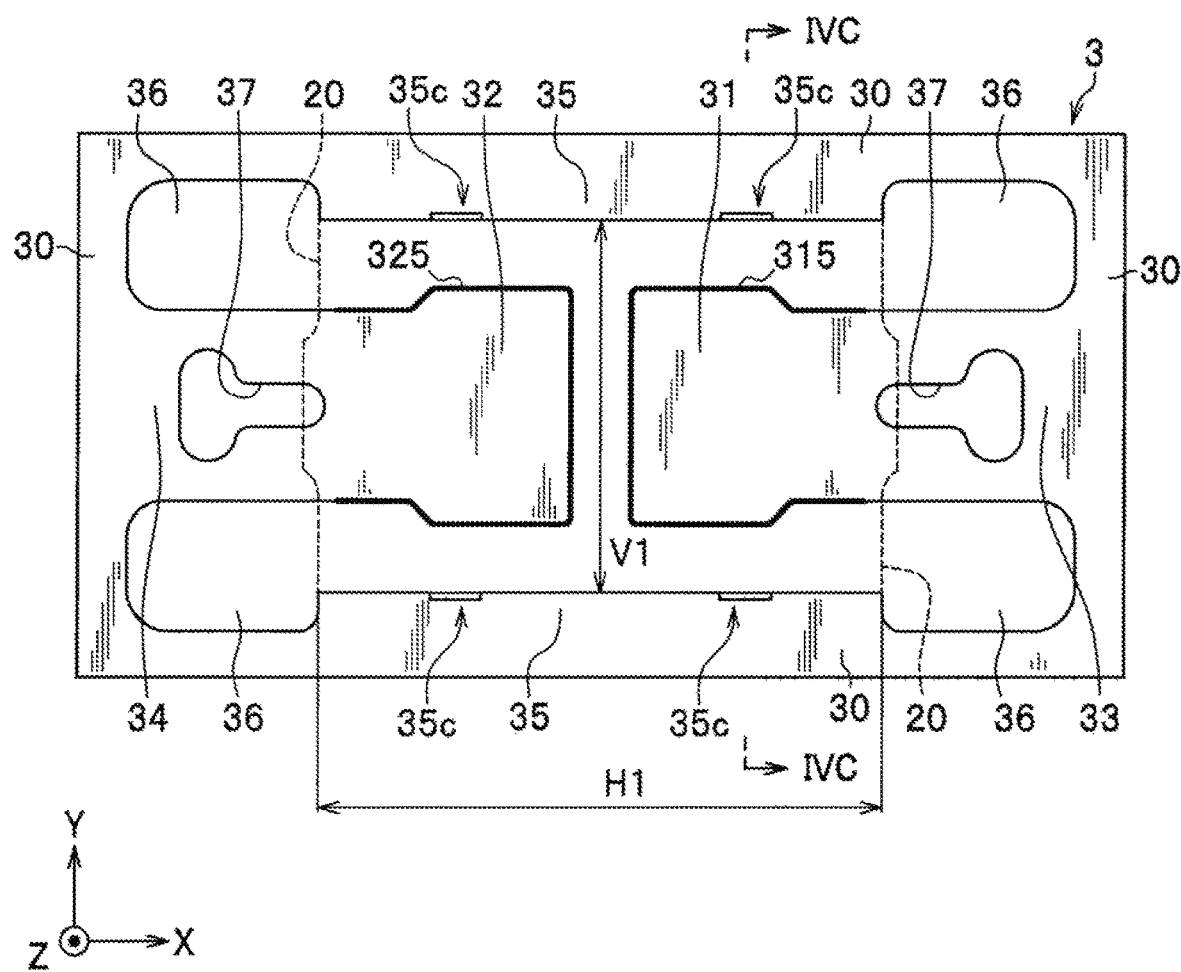
FIG. 4B is a schematic plan diagram illustrating the constitution of the lead frame formed through a step of forming level differences and a step of forming chamfered surfaces in the method for manufacturing the light-emitting device according to the embodiment.
Figure 4C:
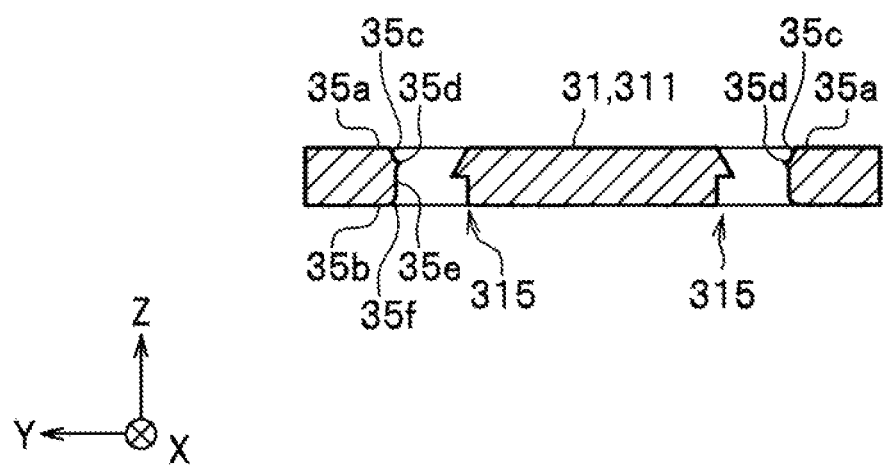
FIG. 4C is a schematic cross-sectional diagram illustrating the constitution of the lead frame formed through the step of forming level differences and the step of forming chamfered surfaces in the method for manufacturing the light-emitting device according to the embodiment taken along the line IVC-IVC in FIG. 4B.
Figure 5A:
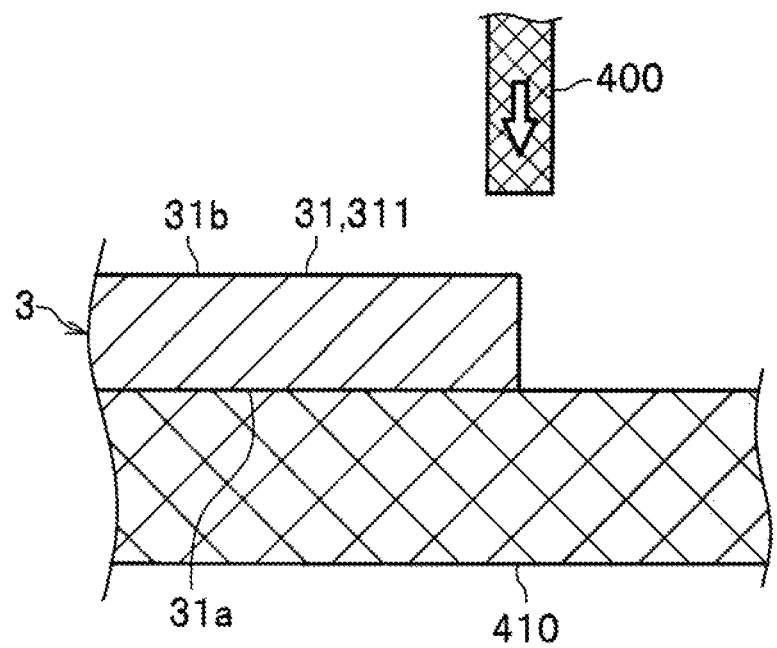
FIG. 5A is a schematic cross-sectional diagram illustrating a first step in the step of forming level differences in the method for manufacturing the light-emitting device according to the embodiment.
Figure 5B:
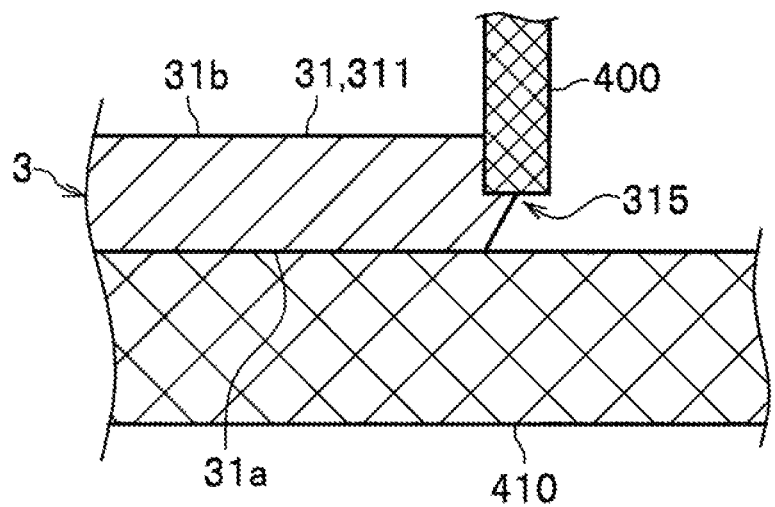
FIG. 5B is a schematic cross-sectional diagram illustrating a second step in the step of forming level differences in the method for manufacturing the light-emitting device according to the embodiment.
Figure 6A:
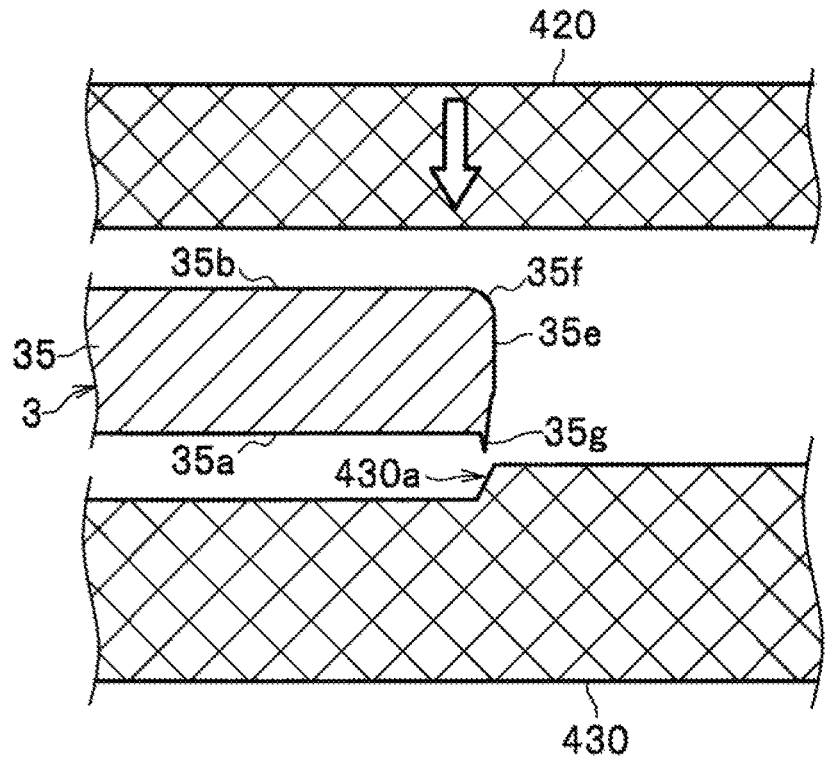
FIG. 6A is a schematic cross-sectional diagram illustrating a first step in the step of forming chamfered surfaces in the method for manufacturing the light-emitting device according to the embodiment.
Figure 6B:
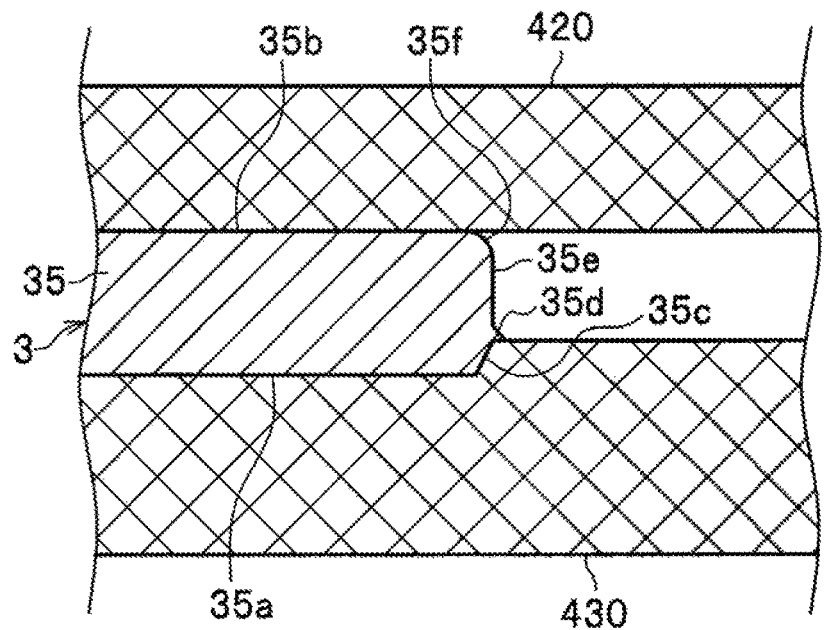
FIG. 6B is a schematic cross-sectional diagram illustrating a second step in the step of forming chamfered surfaces in the method for manufacturing the light-emitting device according to the embodiment.
Figure 7A:
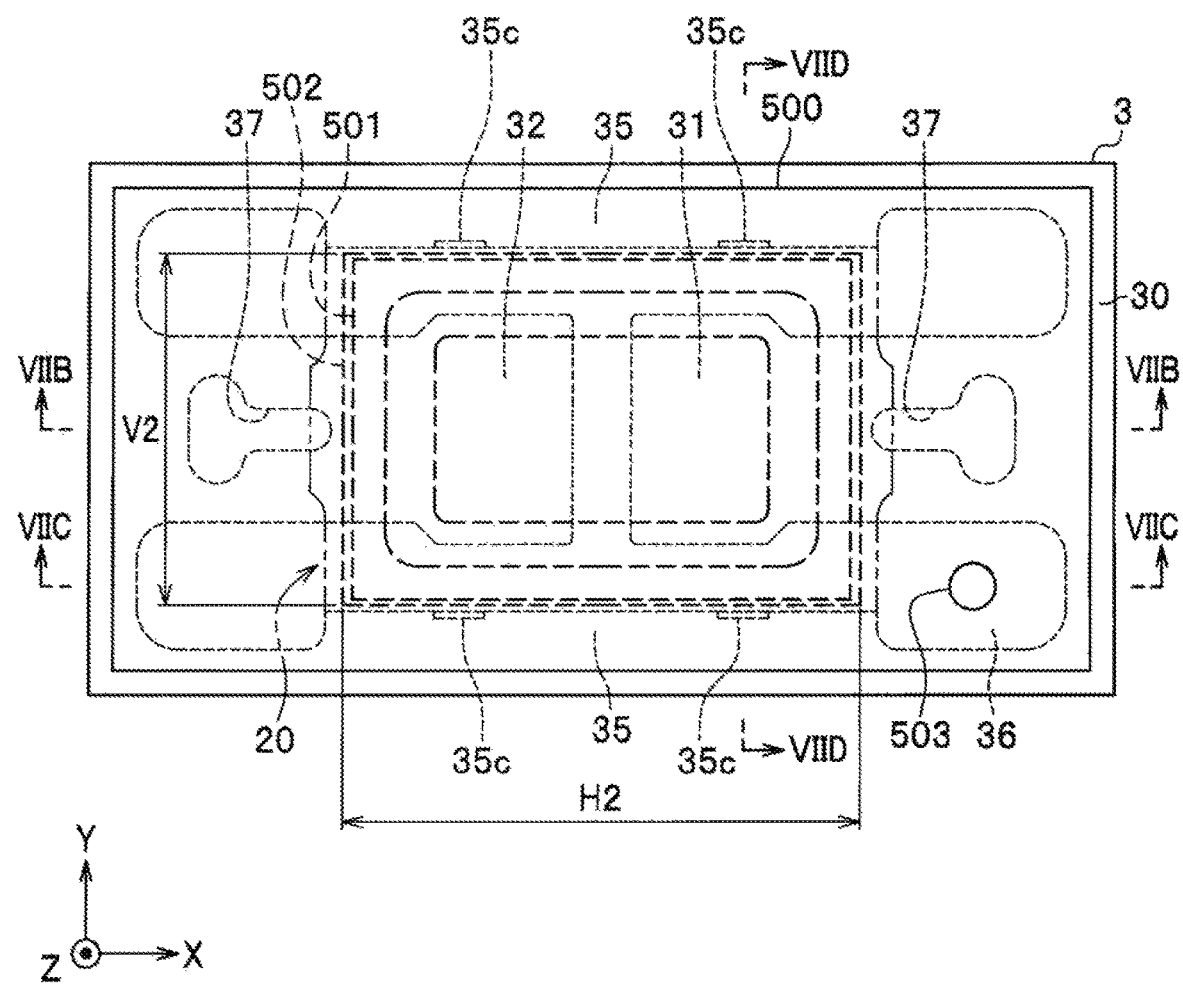
FIG. 7A is a schematic plan diagram illustrating a step of disposing the lead frame in a step of forming a supporting member in the method for manufacturing the light-emitting device according to the embodiment.
Figure 7B:
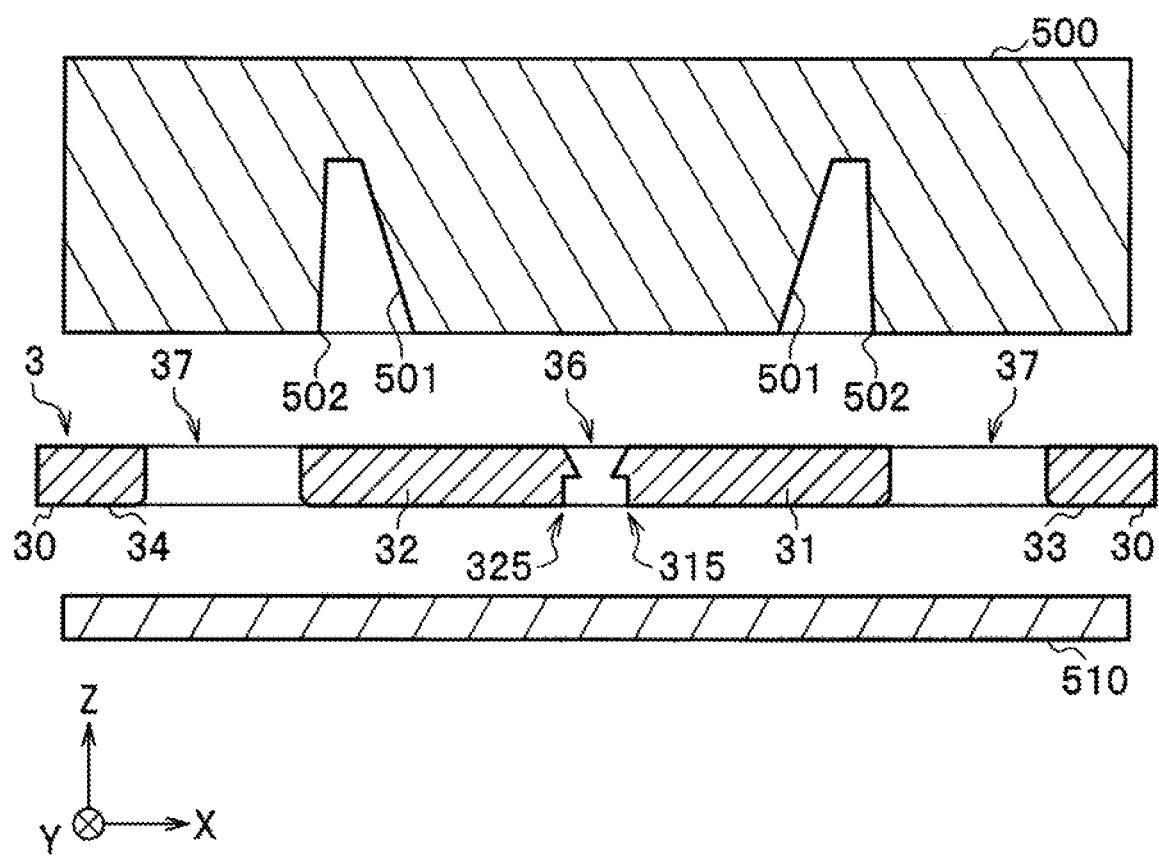
FIG. 7B is a schematic cross-sectional diagram illustrating the step of disposing the lead frame in the step of forming the supporting member in the method for manufacturing the light-emitting device according to the embodiment taken along the line VIIB-VIIB in FIG. 7A.
Figure 7C:
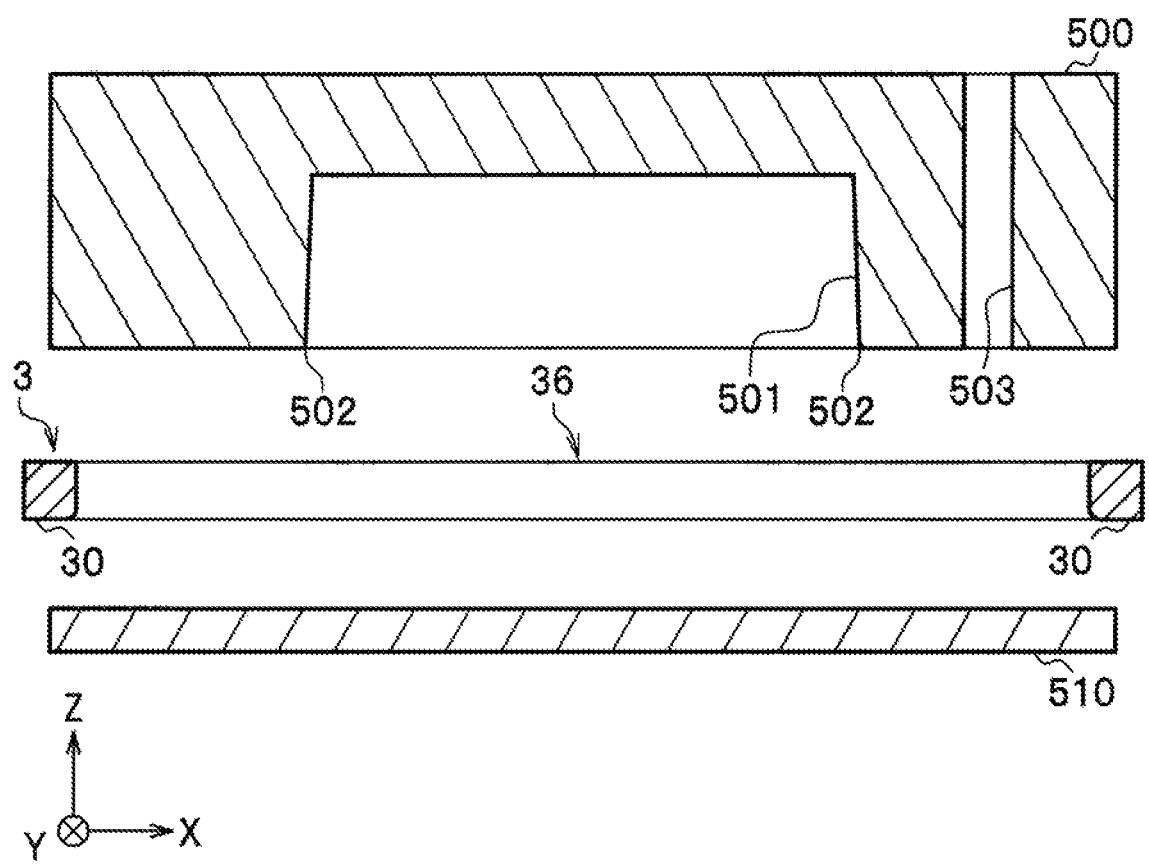
FIG. 7C is a schematic cross-sectional diagram illustrating the step of disposing the lead frame in the step of forming the supporting member in the method for manufacturing the light-emitting device according to the embodiment taken along the line VIIC-VIIC in FIG. 7A.
Figure 7D:
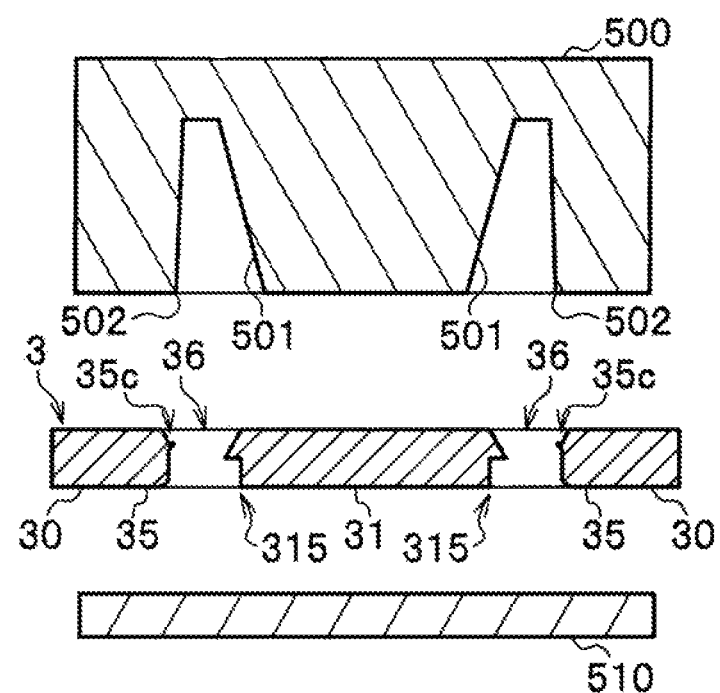
FIG. 7D is a schematic cross-sectional diagram illustrating the step of disposing the lead frame in the step of forming the supporting member in the method for manufacturing the light-emitting device according to the embodiment taken along the line VIID-VIID in FIG. 7A.
Figure 7D:
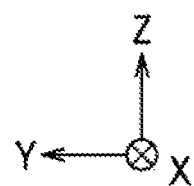
Figure 9:
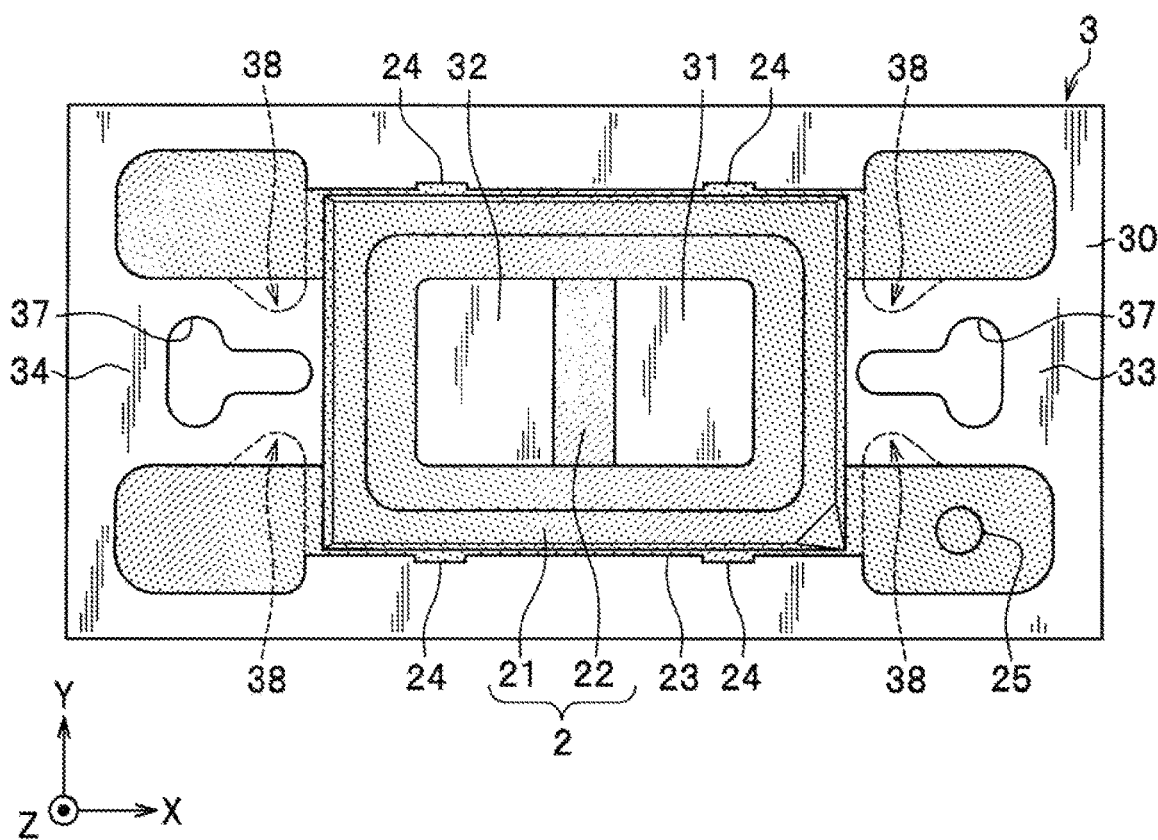
FIG. 9 is a schematic plan diagram illustrating the constitution of the package removed from a mold through a step of solidifying or curing the first resin in the method for manufacturing the light-emitting device according to the embodiment.
Figure 10:
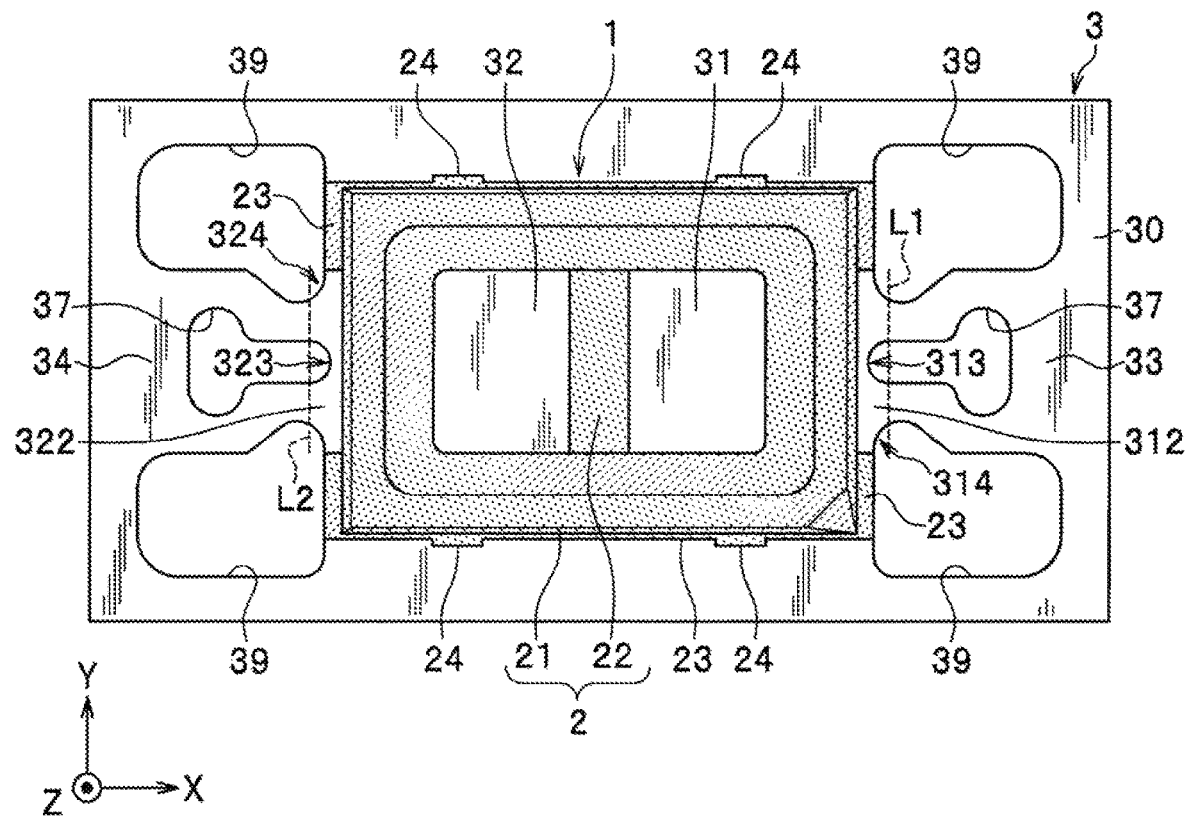
FIG. 10 is a schematic plan diagram illustrating a step of removing an injection mark and a step of separating electrodes in the step of forming the supporting member in the method for manufacturing the light-emitting device according to the embodiment.
Figure 11:
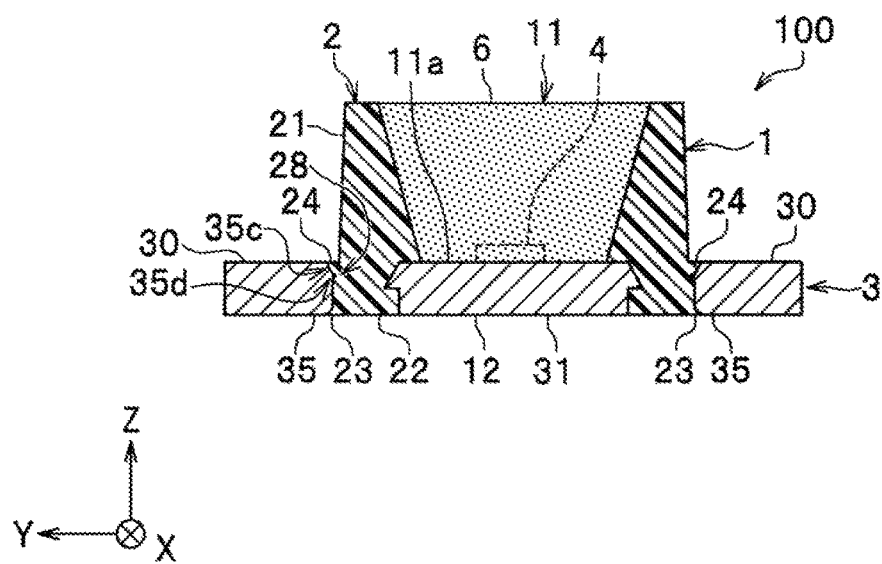
FIG. 11 is a schematic cross-sectional diagram illustrating a step of mounting the light-emitting element and a step of sealing in the method for manufacturing the light-emitting device according to the embodiment at a position corresponding to the line VIID-VIID in FIG. 7A.
Figure 12:
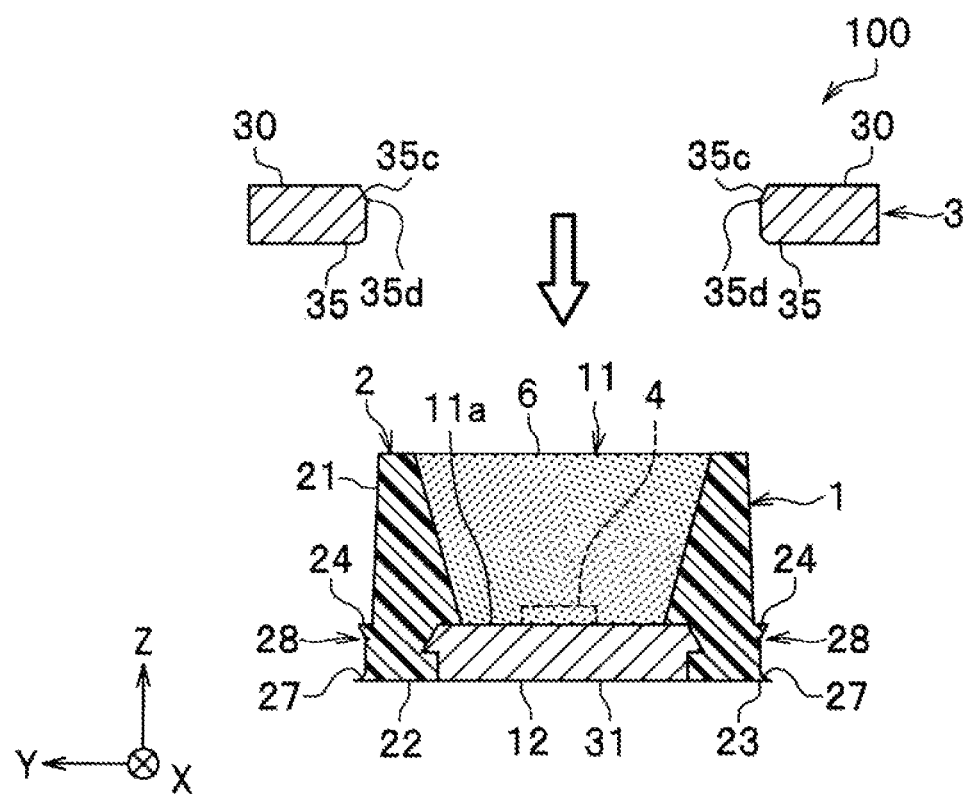
FIG. 12 is a schematic cross-sectional diagram illustrating a step of singulating in the method for manufacturing the light-emitting device according to the embodiment at a position corresponding to the line VIID-VIID in FIG. 7A.

FIG. 3 is a flowchart illustrating the method for manufacturing the light-emitting device according to the embodiment. FIG. 4A is a schematic plan diagram illustrating a constitution of the lead frame formed in a step of forming the outer shape in the method for manufacturing the light-emitting device according to the embodiment. FIG. 4B is a schematic plan diagram illustrating the constitution of the lead frame formed through a step of forming level differences and a step of forming chamfered surfaces in the method for manufacturing the light-emitting device according to the embodiment. FIG. 4C is a schematic cross-sectional diagram illustrating the constitution of the lead frame formed through the step of forming level differences and the step of forming chamfered surfaces in the method for manufacturing the light-emitting device according to the embodiment taken along the line IVC-IVC in FIG. 4B. FIG. 5A is a schematic cross-sectional diagram illustrating a first step in the step of forming level differences in the method for manufacturing the light-emitting device according to the embodiment. FIG. 5B is a schematic cross-sectional diagram illustrating a second step in the step of forming level differences in the method for manufacturing the light-emitting device according to the embodiment. FIG. 6A is a schematic cross-sectional diagram illustrating a first step in the step of forming chamfered surfaces in the method for manufacturing the light-emitting device according to the embodiment. FIG. 6B is a schematic cross-sectional diagram illustrating a second step in the step of forming chamfered surfaces in the method for manufacturing the light-emitting device according to the embodiment. FIG. 7A is a schematic plan diagram illustrating a step of disposing the lead frame in a step of forming a supporting member in the method for manufacturing the light-emitting device according to the embodiment. FIG. 7B is a schematic cross-sectional diagram illustrating the step of disposing the lead frame in the step of forming the supporting member in the method for manufacturing the light-emitting device according to the embodiment taken along the line VIIB-VIIB in FIG. 7A. FIG. 7C is a schematic cross-sectional diagram illustrating the step of disposing the lead frame in the step of forming the supporting member in the method for manufacturing the light-emitting device according to the embodiment taken along the line VIIC-VIIC in FIG. 7A. FIG. 7D is a schematic cross-sectional diagram illustrating the step of disposing the lead frame in the step of forming the supporting member in the method for manufacturing the light-emitting device according to the embodiment taken along the line VIID-VIID in FIG. 7A. FIG. 8A is a schematic cross-sectional diagram illustrating a step of injecting a first resin in the step of forming the supporting member in the method for manufacturing the light-emitting device according to the embodiment at a position corresponding to the line VIIB-VIIB in FIG. 7A. FIG. 8B is a schematic cross-sectional diagram illustrating the step of injecting the first resin in the step of forming the supporting member in the method for manufacturing the light-emitting device according to the embodiment at a position corresponding to the line VIIC-VIIC in FIG. 7A. FIG. 8C is a schematic cross-sectional diagram illustrating the step of injecting the first resin in the step of forming the supporting member in the method for manufacturing the light-emitting device according to the embodiment at a position corresponding to the line VIID-VIID in FIG. 7A. FIG. 8D is a schematic cross-sectional diagram illustrating the step of injecting the first resin in the step of forming the supporting member in the method for manufacturing the light-emitting device according to the embodiment and showing a partial enlarged view of the region VIIID enclosed by the dashed line in FIG. 8C. FIG. 9 is a schematic plan diagram illustrating the constitution of the package removed from a mold through a step of solidifying or curing the first resin in the method for manufacturing the light-emitting device according to the embodiment. FIG. 10 is a schematic plan diagram illustrating a step of removing an injection mark and a step of separating electrodes in the step of forming the supporting member in the method for manufacturing the light-emitting device according to the embodiment. FIG. 11 is a schematic cross-sectional diagram illustrating a step of mounting the light-emitting element and a step of sealing in the method for manufacturing the light-emitting device according to the embodiment at a position corresponding to the line VIID-VIID in FIG. 7A. FIG. 12 is a schematic cross-sectional diagram illustrating a step of singulating in the method for manufacturing the light-emitting device according to the embodiment at a position corresponding to the line VIID-VIID in FIG. 7A.

In FIG. 4B, the thick lines represent the regions in which the level-difference structures 315 and 325 are formed on the outer peripheries of the first electrode 31 and the second electrode 32.

The method for manufacturing the light-emitting device according to the present embodiment includes a step S10 of providing a lead frame, a step S20 of forming a supporting member, a step S30 of mounting a light-emitting element, a step S40 of sealing, and a step S50 of singulating.

The step S10 of providing a lead frame provides the lead frame 3 including the first electrode 31, the second electrode 32, and the hanger leads 35 by working a flat metal plate. The step S10 of a providing a lead frame includes a step S11 of forming the outer shape, a step S12 of forming level differences, a step S13 of forming chamfered surfaces, and a step S14 of plating.

The step S11 of forming the outer shape forms the lead frame 3 in which the outer shapes of the first electrode 31, the second electrode 32, and the hanger leads 35 are formed by performing punching, which is a type of stamping, of a flat metal plate.

The metal plate, which is a raw material, is not limited to particular materials among materials used for lead frames of packages of semiconductor elements. The thickness of the metal plate is selected as appropriate depending on the shape and the size of the package. The thickness is, for example, about 100 to 500 µm further preferably 120 to 300 µm. Examples of the material of the metal plate include Cu-based alloys.

Punching, which is a type of stamping, forms an H-shaped through hole 36 in a plan view for forming the outer shape of each of the first electrode 31, the second electrode 32, and the hanger leads 35, and T-shaped through holes 37 in a plan view for forming the dents 313 and 323 disposed on the ends of the outer-lead portions 312 and 322. The through holes 37 are formed across the outline of a region 20 (a supporting member forming region) in which the supporting member 2 is to be formed.

The lead frame 3 is used at the time the package 1 is formed so that the lower surface will be the "rollover surface", which is the surface on the punch side in stamping for forming the through holes 36 and 37. In other words, the lead frame 3 is used so that the upper surface will be the opposite "burr surface", that is, the surface on the die side. This constitution prevents a metal burr from being generated on the lower surface 12 side, which is the mounting surface, of the package 1 and enables the mounting surface to be formed flat.

In the lead frame 3 formed in this step, the portions formed within the region 20 in which the supporting member 2 is to be formed in a plan view are intended to be the first electrode 31 and the second electrode 32. The end of the first electrode 31 faces the end of the second electrode 32 with a gap therebetween in the central portion of the region 20 in which the supporting member 2 is to be formed in the longitudinal direction. The first electrode 31 is connected to an outer frame 30 via a connecting portion 33 extending outward from one of the pair of short sides of the region 20 in which the supporting member 2 is to be formed that is rectangular in a plan view. The second electrode 32 is connected to the outer frame 30 via a connecting portion 34 extending outward from the other short side.

The two hanger leads 35 each extend from the outer frame 30 toward the region 20 in which the supporting member 2 is to be formed, and their ends are in contact with the outline of the region 20 in which the supporting member 2 is to be formed over approximately the entire width in the longitudinal direction (X-axis direction).

The case where one package 1 is manufactured will be described, but a plurality of packages 1 may be manufactured so that the packages 1 will be arranged unidimensionally or two-dimensionally. In this case, for example, a bunch of lead frames may be formed in which the lead frames 3 each shown in FIG. 4A are continuously arranged unidimensionally or two-dimensionally.

The step S12 of forming level differences forms the level-difference structure 315 on the outer periphery of the inner-lead portion 311 of the first electrode 31 and forms the lever-difference structure 325 on the outer periphery of the inner-lead portion 321 of the second electrode 32. The level-difference structures 315 and 325 can be formed by crushing the outer peripheries with a punch by stamping. This step includes two sub-steps below.

FIG. 5A and FIG. 5B show the step of forming the level-difference structure 315 on the first electrode 31. The step of forming the level-difference structure 325 on the second electrode 32 is performed in approximately the same manner.

In the first step, the lead frame 3 in which the outer shape of each member has been formed in the step S11 of forming the outer shape is disposed on a lower mold (die) 410 having a flat upper surface. At this time, the burr surface, which is intended to be the upper surface 31a of the first electrode 31 at the time of forming the package 1, faces down. An upper mold (punch) 400 is then moved down toward the outer periphery of the inner-lead portion 311.

Next, in the second step, the outer periphery of the inner-lead portion 311 of the first electrode 31 is crushed by pressing with the upper mold 400 and the lower mold 410 to form on the outer periphery the level-difference structure 315 having a depression on the side intended to be the lower surface 31b at the time of forming the package 1.

The lower part that has been crushed has preferably about 0.2 to 0.8 times, more preferably about 0.3 to 0.7 times the thickness of the original metal plate. The depth of the end to be crushed is preferably about 0.2 to 2 times, more preferably about 0.3 to 1 times as large as the thickness of the original metal plate. This constitution enables the first electrode 31 and the second electrode 32 to be firmly secured by the supporting member 2 and to be less likely to be separated.

Although the die that is the fixed mold is used as the lower mold 410 and the punch that is the movable mold is used as the upper mold 400 for convenience, the molds may be used upside down. That is, the die may be disposed on the upper side, and the punch may be disposed on the lower side. Alternatively, the punch and the die may be disposed laterally.

The step S13 of forming chamfered surfaces forms chamfered or beveled surfaces 35c on at least part of the corners on the upper surfaces 35a side of the ends of the hanger leads 35.

The shape of the chamfered surfaces 35c corresponds to the above shape of the projections 24 of the supporting member 2. Accordingly, the width of the chamfered surfaces 35c coincides with the width A1, the chamfering length of the chamfered surfaces 35c on the upper surfaces 35a side coincides with the projecting quantity A2, the chamfering length of the chamfered surfaces 35c on side surfaces 35e side coincides with the height A3, and the inclined angle of the chamfered surfaces 35c with respect to the side surfaces 35e coincides with the inclined angle A4.

The chamfered surfaces 35c can be formed by stamping in which the ends of the hanger leads 35 are pinched with an upper mold 420 and a lower mold 430. Level differences having inclined surfaces 430a corresponding to the shape of the chamfered surfaces 35c are formed on the upper surface of the lower mold 430. The lower surface of the upper mold 420 is flat. This step includes two sub-steps below.

In the first step, the lead frame 3 is mounted on the lower mold 430. At this time, the corners of the ends of the hanger leads 35 on the side intended to be the upper surfaces 35a at the time the package 1 is formed are aligned with the inclined surfaces 430a.

The side surfaces 35e of the ends of the hanger leads 35 are approximately perpendicular. The side intended to be lower surfaces 35b at the time the package 1 is formed is the "rollover surface" in the step S11 of forming the outer shape. The corners on this side have rounded portions 35f. The side intended to be the upper surfaces 35a is the "burr surface", and metal burrs 35g are formed on the corners.

Next, in the second step, the chamfered surfaces 35c are formed by stamping in which the ends of the hanger leads 35 are pinched with the upper mold 420 and the lower mold 430. At this time, the metal burrs 35g are also crushed in the regions in which the chamfered surfaces 35c are to be formed. Excess metal generated by chamfering is extruded outward (right side in FIG. 6B) to form the projecting portions 35d.

The projecting portions 35d may not be formed but are preferably formed because the holding force of the hanger leads 35 for the package 1 can be enhanced. In addition, forming the projecting portions 35d can also prevent the package 1 from falling upward off the lead frame 3.

The method for forming the chamfered surfaces 35c is not limited to stamping. In the case where the projecting portions 35d are not formed, for example, the chamfered surfaces 35c can be formed by cutting.

Any of the step S12 of forming level differences and the step S13 of forming chamfered surfaces may be performed first. In the case of stamping, both steps may be performed at the same time.

In the step S14 of plating, electrolytic plating with Ag or the like is performed on the surface of the lead frame 3 to increase at least one of the light reflectance and the solder bondability. In this step, the upper surface and the lower surface of the lead frame 3 and the side surfaces including the inner side surfaces of the through holes 36 and 37 are plated.

Instead of the step S14 of plating, the step S11 of forming the outer shape to the step S13 of forming chamfered surfaces may be performed using a plated metal plate as the raw material of the lead frame 3.

In the step S20 of forming a supporting member, the first resin is molded into the supporting member 2 that supports the first electrode 31 and the second electrode 32 of the lead frame 3. The step S20 of forming a supporting member includes a step S21 of disposing the lead frame, a step S22 of injecting a first resin, a step S23 of solidifying or curing the first resin, a step S24 of removing an injection mark, and a step S25 of separating electrodes.

The resin material (first resin) used for forming the supporting member 2 can be any of the above thermoplastic resins and the thermosetting resins. The supporting member 2 can be molded by injection molding in the case where a thermoplastic resin such as polyphthalamide resin is used as the resin material or by transfer molding in the case where a thermosetting resin such as an epoxy resin is used.

The step S21 of disposing the lead frame disposes the lead frame 3 between an upper mold 500 and a lower mold 510, which are molds for molding. The upper mold 500 includes a cavity 501 corresponding to the shape of the wall portion 21 of the supporting member 2 and a flat portion adjacent to the cavity 501. The cavity 501 is continuous in a ring shape in a plan view.

The lead frame 3 is disposed so that the position in which the wall portion is to be formed in the region 20 in which the supporting member 2 is to be formed will coincide with an outer edge 502 of the cavity 501 of the upper mold 500 and so that the through holes 37 will be positioned outside the cavity 501 in a plan view.

The upper mold 500 includes a gate 503 that is used for injecting the first resin and is disposed inside the region in which the through hole 36 of the lead frame 3 is disposed and outside the region 20 in which the supporting member 2 is to be formed in a plan view at the time the upper mold 500 is aligned with the lead frame 3. The upper surface of the lower mold 510 is flat.

In the step S22 of injecting a first resin, the first resin is injected into the mold for molding through the gate 503 with the lead frame 3 sandwiched between the upper mold 500 and the lower mold 510.

The gate 503, the through hole 36, and the cavity 501 are in communication with one another, and the through holes 37 are not in communication with these spaces. Accordingly, the first resin is injected into the through hole 36 and the cavity 501 but is not injected into the through holes 37.

In the step S23 of solidifying or curing the first resin, the resin injected into the mold for molding is solidified or cured.

In the case where a thermoplastic resin is used as the resin material, cooling a heat-molten thermoplastic resin to cause the resin to be in the solid state is referred to as "solidifying". In the case where a thermosetting resin is used as the resin material, heating a liquid thermosetting resin to cause the resin to be in the solid state is referred to as "curing".

The first resin charged into the cavity 501 of the upper mold 500 and the through hole 36 of the lead frame 3 is solidified or cured to form the wall portion 21 in the cavity 501 and the bottom portion 22 in the through hole 36. The bottom portion 22 is formed so that the first-resin molding will extend continuously to a region outside the region 20 in which the supporting member 2 is to be formed in the through hole 36 in a plan view. The first electrode 31 and the second electrode 32 of the lead frame 3 are supported by the supporting member 2 including the wall portion 21 and the bottom portion 22. The first resin remaining in the gate 503 turns into the solid state to form a gate mark 25.

Forming the chamfered surfaces 35c forms dents on the corners on the upper surfaces 35a side of the ends of the hanger leads 35. The projections 24 of the supporting member 2 are formed to fit the dents. In addition, the grooves 28 of the supporting member 2 are formed to fit the projecting portions 35d formed on the ends of the hanger leads 35. Thus, the package 1 is less likely to fall off the lead frame 3.

The rounded portions 35f are formed on the corners because the lower surfaces 35b of the hanger leads 35 are the rollover surfaces in stamping. At the time of forming the supporting member 2 by molding, the first resin enters the rounded portions 35f to form the resin burrs 27.

The level-difference structures 315 and 325 formed on the outer peripheries of the inner-lead portions 311 and 321 of the first electrode 31 and the second electrode 32 enables supporting so that separation from the supporting member 2 will not be easy.

The step S24 of removing an injection mark removes the gate mark 25, which is a mark formed in injecting the first resin into the upper mold 500, and unnecessary portions of the first resin extending in the through hole 36. The step S24 of removing an injection mark also removes regions 38 that are part of borderline regions between the first electrode 31 and the connecting portion 33 and between the second electrode and the connecting portion 34.

Punching of stamping is performed along portions of the outline of the through hole 36 outside the region 20 in which the supporting member 2 is to be formed to form through holes 39, so that unnecessary portions of the first resin are removed. Since the gate mark 25 is formed on an extending portion of the first resin outside the region 20 in which the supporting member 2 is to be formed in the present embodiment, this step also removes the gate mark 25. Accordingly, a finished package 1 does not have the gate mark 25. Thus, the package 1 can be thin.

The through holes 39 are formed so that the above regions 38 of the lead frame 3 will be included, thereby forming the dents 314 and 324 on the ends of the outer-lead portions 312 and 322. Only unnecessary portions of the first resin may be removed in this step, but removing the regions 38 of the lead frame 3 can narrow the width at which the outer-lead portion 312 is connected to the connecting portion 33 and the width at which the outer-lead portion 322 is connected to the connecting portion 34. Narrowing these connecting widths facilitates cutting the first electrode 31 and the second electrode 32 out of the lead frame 3 in the step S25 of separating electrodes.

The step S25 of separating electrodes separates the first electrode 31 and the second electrode 32 from the lead frame 3. In this step, stamping is performed along cutting lines L1 and L2 on borderlines between the first and second electrodes 31 and 32 and the connecting portions 33 and 34 to cut the lead frame 3.

At this time, the metal plate material of the lead frame 3 is exposed on the end surfaces 31c of the outer-lead portions 312 and 322 and the side surfaces of the dents 314 and 324, but the side surfaces of the dents 313 and 323 are good in solder wettability because the side surfaces have been plated. Solder fillets can be thus formed on the side surfaces of the dents 313 and 323 to increase the connecting strength at the time of solder-connecting the package 1 with the lower surfaces 31b and 32b of the first electrode 31 and the second electrode 32 being the mounting surfaces. In addition, the quality of the solder connecting can be determined by observing whether the solder fillets are formed.

Instead of forming the through holes 39 and cutting along the cutting lines L1 and L2, the step S24 of removing an injection mark and the step S25 of separating electrodes can be performed in one stamping step by forming by punching a through hole having a size in which two adjacent through holes 39 for each of the first electrode 31 and the second electrode 32 are connected by the cutting line L1 or the cutting line L2.

Performing this step separates the first electrode 31 and the second electrode 32 from the lead frame 3, but the package 1 is clamped by the two hanger leads 35 and connected to the lead frame 3. Pressing the package 1 with respect to the lead frame 3 from the upper side toward the lower side (toward the negative direction of the Z axis) can remove the package 1 from the lead frame 3.

In the step S30 of mounting a light-emitting element, the light-emitting element 4 is mounted in the depression 11 in the package 1.

The light-emitting element 4 has a one-side electrode structure in which the n-side electrode and the p-side electrode are formed on the upper side and is face-up mounted. Accordingly, the lower side of the light-emitting element 4 is connected to the upper surface of the second electrode 32 with an insulating die-bonding member. The n-side electrode and the p-side electrode of the light-emitting element 4 are respectively connected to the upper surfaces of the electrodes having the corresponding polarities in the first electrode 31 and the second electrode 32 through the wires 5 (see FIG. 1).

While the light-emitting element 4 has the positive and negative electrodes disposed on the same side and is face-up mounted, the light-emitting element 4 may be face-down (flip-chip) mounted, or the positive and negative electrodes may be disposed on different sides.

The step S40 of sealing covers the light-emitting element 4, the protective element, and the wires 5 mounted in the depression 11 with the sealing member 6.

This step is performed by applying the sealing member 6 to the depression 11. The method for applying the sealing member 6 is preferably potting. After filling the depression 11 with a liquid resin material or the like, the sealing member 6 can be formed by solidifying or curing the resin.

Potting is preferable because air remaining in the depression 11 can be effectively discharged. The method for filling the depression 11 with the sealing member 6 can be any of various printing methods and resin molding methods.

In the step S50 of singulating, the light-emitting device 100 is singulated by removing the light-emitting device 100 clamped by the two hanger leads 35 and connected to the outer frame 30 of the lead frame 3 from the hanger lead 35.

As described above, pressing the package 1 with respect to the lead frame 3 from the upper side toward the lower side (toward the negative direction of the Z axis) can separate the package 1 from the lead frame 3. Since the package 1 is singulated by pressing downward, the resin burrs 27 formed on the lower surface 12 of the package 1 is not pressed from the hanger leads 35. Thus, the resin burrs 27 do not undergo such deformation as to protrude toward the lower surface 12 side, which is the mounting surface of the light-emitting device 100, of the package 1. In other words, since the mounting surface of the light-emitting device 100 is kept flat, decrease in the mountability can be suppressed.

Performing the steps as described above enables the light-emitting devices 100 to be manufactured.

The step S30 of mounting a light-emitting element and the step S40 of sealing may be performed after the step S23 of solidifying or curing the first resin and before the step S24 of removing an injection mark or the step S25 of separating electrodes. That is, the light-emitting device 100 may be singulated after mounting and sealing the light-emitting element 4 while the package 1 is firmly connected to the lead frame 3 through not only the hanger leads 35 but the connecting portions 33 and 34.

The step S30 of mounting a light-emitting element and the step S40 of sealing may be performed after the step S50 of singulating. That is, the light-emitting element 4 may be mounted and sealed after the package 1 is singulated.

[Example]

The light-emitting device shown in FIG. 1 is produced by the above manufacturing method under the following conditions.

A Cu metal plate plated with Ag is used as the raw material for the lead frame.

Forming is performed by injection molding using polyphthalamide resin as the material for the supporting member.

Particles of titanium oxide are incorporated in the resin material of the supporting member to cause the reflectance of the inner side surfaces of the depression of the supporting member to be equal to or more than 70%. This reflectance is based on the value at the emission peak wavelength of the light-emitting element.

A blue nitride light-emitting diode having an emission peak at about 460 nm is used as the light-emitting element.

A silicone resin is used as the sealing member.

The outer shape of the package is a box shape having dimensions of about 2.1 mm in vertical length, about 1.4 mm in lateral length, and about 0.7 mm in height. The thickness of the wall portion is about 0.1 to 0.3 mm. The thicknesses of the lead frame and the flange are about 0.2 mm. The projections are disposed in two positions nearer to both ends of each side surface of the bottom portion in the longitudinal direction. Each projection is about 0.2 mm in width, about 0.03 mm in projecting quantity, and about 0.06 mm in height, and the inclined angle of the side surface is about 30°.

The shape of the projection coincides with the shape of a dent formed by forming the chamfered surface on the corner of the end of the hanger lead.

The resin burrs having lengths of about 0.01 to 0.1 mm are formed along the lower ends of the side surfaces extending in the longitudinal direction of the package.

The resin extending outside the supporting member forming region is removed by punching of stamping. The first electrode and the second electrode are then cut out of the outer frame by stamping. At this time, the package is held by the hanger leads. The resulting light-emitting device (package) is less likely to fall off the lead frame than in the case where no projections are disposed, that is, the case where no chamfered surfaces are disposed on the ends of the hanger leads.

After mounting the light-emitting element on the package and sealing the light-emitting element to produce the light-emitting device, the light-emitting device is singulated by applying force to the light-emitting device from the upper side.

In the singulated light-emitting device, the projections corresponding to the chamfered surfaces of the hanger leads were deformed upward, but the resin burrs formed on the lower side, which was the mounting surface, were not deformed. Thus, the mounting surface was kept flat and can well adhere to a mounting board.

The light-emitting device according to the embodiment of the present disclosure can be used for light-emitting devices for lighting apparatuses and vehicles.

The invention claimed is:

1. A method for manufacturing a lead frame, the method comprising:
    punching a metal plate disposed on a die with a punch in a direction from the metal plate toward a die side to form a punched metal, the punched metal including
        at least one electrode,
        at least one hanger lead separated from the at least one electrode, and
        an outer frame connected to the at least one electrode and the at least one hanger lead; and
    stamping at least part of a corner of an end of the at least one hanger lead, the corner being on a side corresponding to the die side, with a vertically split mold to form at least one chamfered surface and a projecting portion adjacent to the at least one chamfered surface.

2. A method for manufacturing a package, the method comprising:
    performing the method for manufacturing a lead frame according to claim 1 to form the lead frame;
    sandwiching the at least one electrode between an upper mold and a lower mold of a vertically split mold for molding;
    injecting a first resin into the mold for molding sandwiching the at least one electrode; and
    solidifying or curing the injected first resin to form a supporting member.

3. The method for manufacturing a package according to claim 2, wherein
    the lead frame is formed integrally with the supporting member supporting the at least one electrode to form the package having a depression in which a light-emitting element is intended to be mounted,
    the depression is open on an upper side,
    side surfaces of the depression are constituted of the supporting member,
    at least a part of a bottom surface of the depression includes the at least one electrode,
    the at least one electrode is disposed in a supporting member forming region, the at least one hanger lead extends from the outer frame to contact with the supporting member forming region, and the at least one chamfered surface is formed on the end of the at least one hanger lead, the end being on the upper side of the package facing the supporting member forming region.

4. The method for manufacturing a light-emitting device according to claim 3, further comprising applying a second resin into the depression to seal the light-emitting element after the mounting the light-emitting element.

5. A method for manufacturing a light-emitting device, the method comprising:

performing the method for manufacturing a package according to claim 3 to form the package; and mounting the light-emitting element in the depression.

6. The method for manufacturing a light-emitting device according to claim 5, further comprising cutting the at least one electrode out of the outer frame after the solidifying or curing of the injected first resin or after the mounting of the light-emitting element in the depression.

7. The method for manufacturing a light-emitting device according to claim 6, further comprising pressing the package from an upper side to a lower side to singulate the package after the cutting the at least one electrode out of the outer frame.

8. The method of manufacturing a lead frame according to claim 1, wherein the punching of the metal plate includes forming a rounded portion at least at a corner of the at least one hanger lead opposite to the corner at which the at least one chamfered surface is to be formed.

9. A method for manufacturing a lead frame, the method comprising:

disposing a metal plate on a die;

punching the metal plate with a punch in a direction from the metal plate toward a die side to form at least one electrode and at least one hanger lead separated from the at least one electrode; and performing stamping to chamfer at least a part of a corner of an end of the at least one stamped hanger lead and to form a projecting portion adjacent to a chamfered surface, the corner being on a side corresponding to the die side.

10. The method of manufacturing a lead frame according to claim 9, wherein the punching of the metal plate includes forming a rounded portion at least at a corner of the at least one hanger lead opposite to the corner at which the chamfered surface is to be formed.

11. A method for manufacturing a lead frame, the method comprising:

punching a metal plate from a lower direction toward an upper direction to form a punched metal, the punched metal comprising:

at least one electrode;

at least one hanger lead separated from the at least one electrode; and an outer frame connected to the at least one electrode and the at least one hanger lead; and stamping at least a part of a corner of an end of the at least one hanger lead, the corner being on an upper side of the punched metal, with a vertically split mold to form at least one chamfered surface and a projecting portion adjacent to the at least one chamfered surface.

12. The method of manufacturing a lead frame according to claim 11, wherein the punching of the metal plate includes forming a rounded portion at least at a corner of the at least one hanger lead opposite to the corner at which the at least one chamfered surface is to be formed.

* * * * *